United States Patent
Zeng

(10) Patent No.: US 9,378,463 B2
(45) Date of Patent: *Jun. 28, 2016

(54) SYSTEM AND METHOD FOR FUSING OUTPUTS FROM MULTIPLE LIDAR SENSORS

(71) Applicant: GM GLOBAL TECHNOLOGY OPERATIONS LLC, Detroit, MI (US)

(72) Inventor: Shuqing Zeng, Sterling Heights, MI (US)

(73) Assignee: GM Global Technology Operations LLC, Detroit, MI (US)

(*) Notice: Subject to any disclaimer, the term of this patent is extended or adjusted under 35 U.S.C. 154(b) by 0 days.

This patent is subject to a terminal disclaimer.

(21) Appl. No.: 14/828,383

(22) Filed: Aug. 17, 2015

(65) Prior Publication Data

US 2015/0356454 A1 Dec. 10, 2015

Related U.S. Application Data

(63) Continuation of application No. 13/789,379, filed on Mar. 7, 2013, now Pat. No. 9,129,211.

(60) Provisional application No. 61/611,471, filed on Mar. 15, 2012.

(51) Int. Cl.
- *G06F 17/50* (2006.01)
- *G06N 7/00* (2006.01)
- *G01S 17/66* (2006.01)
- *G01S 17/93* (2006.01)

(52) U.S. Cl.
CPC ............... *G06N 7/005* (2013.01); *G01S 17/66* (2013.01); *G01S 17/936* (2013.01); *G06F 17/5009* (2013.01)

(58) Field of Classification Search
USPC ........... 703/2, 5; 701/301; 356/4.01; 382/111
See application file for complete search history.

(56) References Cited

U.S. PATENT DOCUMENTS

| | | | |
|---|---|---|---|
| 9,129,211 B2* | 9/2015 | Zeng | G06N 7/005 |
| 2010/0111370 A1* | 5/2010 | Black | G06K 9/00369 |
| | | | 382/111 |
| 2013/0242284 A1* | 9/2013 | Zeng | G01S 17/66 |
| | | | 356/4.01 |
| 2013/0242285 A1* | 9/2013 | Zeng | G01S 17/58 |
| | | | 356/28 |
| 2013/0297525 A1* | 11/2013 | Skaaksrud | G06Q 10/0833 |
| | | | 705/333 |

* cited by examiner

*Primary Examiner* — Thai Phan
(74) *Attorney, Agent, or Firm* — John A. Miller; Miller IP Group, PLC

(57) ABSTRACT

A system and method for fusing the outputs from multiple LiDAR sensors. The method includes providing object files for objects detected by the sensors at a previous sample time, where the object files identify the position, orientation and velocity of the detected objects. The method also includes receiving a plurality of scan returns from objects detected in the field-of-view of the sensors at a current sample time and constructing a point cloud from the scan returns. The method then segments the scan points in the point cloud into predicted clusters, where each cluster initially identifies an object detected by the sensors. The method matches the predicted clusters with predicted object models generated from objects being tracked during the previous sample time. The method creates new object models, deletes dying object models and updates the object files based on the object models for the current sample time.

20 Claims, 12 Drawing Sheets

SYSTEM AND METHOD FOR FUSING OUTPUTS FROM MULTIPLE LIDAR SENSORS

CROSS-REFERENCE TO RELATED APPLICATIONS

This application is a Continuation application of U.S. patent application Ser. No. 13/789,379, titled Bayesian Network to Track Objects Using Scan Points Using Multiple LiDAR Sensors, filed Mar. 7, 2013, now U.S. Pat. No. 9,129,211 issued Sep. 8, 2015, which claims the benefit of the priority date of U.S. Provisional Patent Application Ser. No. 61/611,471, titled, Bayesian Network to Track Objects Using Scan Points Using Multiple LiDAR Sensors, filed Mar. 15, 2012.

BACKGROUND OF THE INVENTION

1. Field of the Invention

This invention relates generally to a system and method for fusing the outputs from multiple sensors on a vehicle and, more particularly, to a system and method for fusing scan points from multiple LiDAR sensors on a vehicle using a Bayesian network.

2. Discussion of the Related Art

Many modern vehicles include object detection sensors that are used to enable collision warning or avoidance and other active safety applications. The object detection sensors may use any of a number of detection technologies, such as short range radar, cameras with image processing, laser or LiDAR, ultrasound, etc. The object detection sensors detect vehicles and other objects in the path of a host vehicle, and the application software uses the object detection information to provide warnings or take actions as appropriate. In many vehicles, the object detection sensors are integrated directly into the front or other fascia of the vehicle.

In order for the application software to perform optimally, the object detection sensors must be aligned properly with the vehicle. For example, if a sensor detects an object that is actually in the path of the host vehicle but, due to sensor misalignment, the sensor determines that the object is slightly to the left of the path of the host vehicle, this can have significant consequences for the application software. Even if there are multiple forward looking object detection sensors on a vehicle, it is important that they are all aligned properly, so as to minimize or eliminate conflicting sensor readings.

LiDAR sensors are one type of sensor that are sometimes employed on vehicles to detect objects around the vehicle and provide a range to those objects. LiDAR sensors are desirable because they are able to provide the heading of a tracked object, which other types of sensors, such as vision systems and radar sensors, are generally unable to do. For one type of LiDAR sensor, reflections from an object are returned as a scan point as part of a point cluster range map, where a separate scan point is provided for every ½° across the field-of-view of the sensor. Therefore, if a target vehicle is detected in front of the host vehicle, there may be multiple scan points that are returned that identify the distance of the target vehicle from the host vehicle.

A vehicle may have multiple LiDAR sensors to provide a 360° field-of-view around the vehicle. These multiple LiDAR sensors may include side looking sensors, rearward looking sensors and forward looking sensors. Each of the sensors track objects in its field-of-view independently of the other sensors. Using the scan point returns from the multiple sensors, the range map is generated to track objects in proximity to the host vehicle. For a vehicle with multiple LiDAR sensors, multiple point cluster maps are returned, and for overlapping sensor field-of-views, the sensors may be tracking the same object. It is necessary to combine the scan point maps of the sensors so that the same object tracked by the sensors is processed as a single target.

U.S. patent application Ser. No. 12/942,456, titled, Systems and Methods for Tracking Objects, filed Nov. 9, 2010, assigned to the assignee of this application and herein incorporated by reference, discloses a technique for monitoring the range and heading of a target object from a host vehicle using LiDAR sensors. This application is limited to a single LiDAR sensor, and does not discuss fusing returns from multiple LiDAR sensors.

SUMMARY OF THE INVENTION

In accordance with the teachings of the present invention, a system and method are disclosed for fusing the outputs from multiple LiDAR sensors using a Bayesian network. The method includes providing object files for objects detected by the LiDAR sensors at a previous sample time, where the object files identify the position, orientation and velocity of the detected objects. The method also includes receiving a plurality of scan returns from objects detected in the field-of-view of the sensors at a current sample time and constructing a point cloud from the scan returns. The method then segments the scan points in the point cloud into predicted scan clusters, where each cluster initially identifies an object detected by the sensors. The method matches the predicted clusters with predicted object models generated from objects being tracked during the previous sample time. The method merges predicted object models that have been identified as separate scan clusters in the previous sample time but are now identified as a single scan cluster and splits predicted object models that have been identified as a single scan cluster in the previous sample time but are now identified as separate scan clusters in the current sample time. The method creates new object models, deletes dying object models and updates the object files based on the object models for the current sample time.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a system and method for fusing the outputs from multiple LiDAR sensors on a vehicle using a Bayesian network is merely exemplary in nature, and is in no way intended to limit the invention or its applications or uses. For example, the present invention will be described for fusing the outputs of LiDAR sensors on a vehicle. However, as will be appreciated by those skilled in the art, the fusing process of the invention will have application other than vehicle applications.

Figure 1:
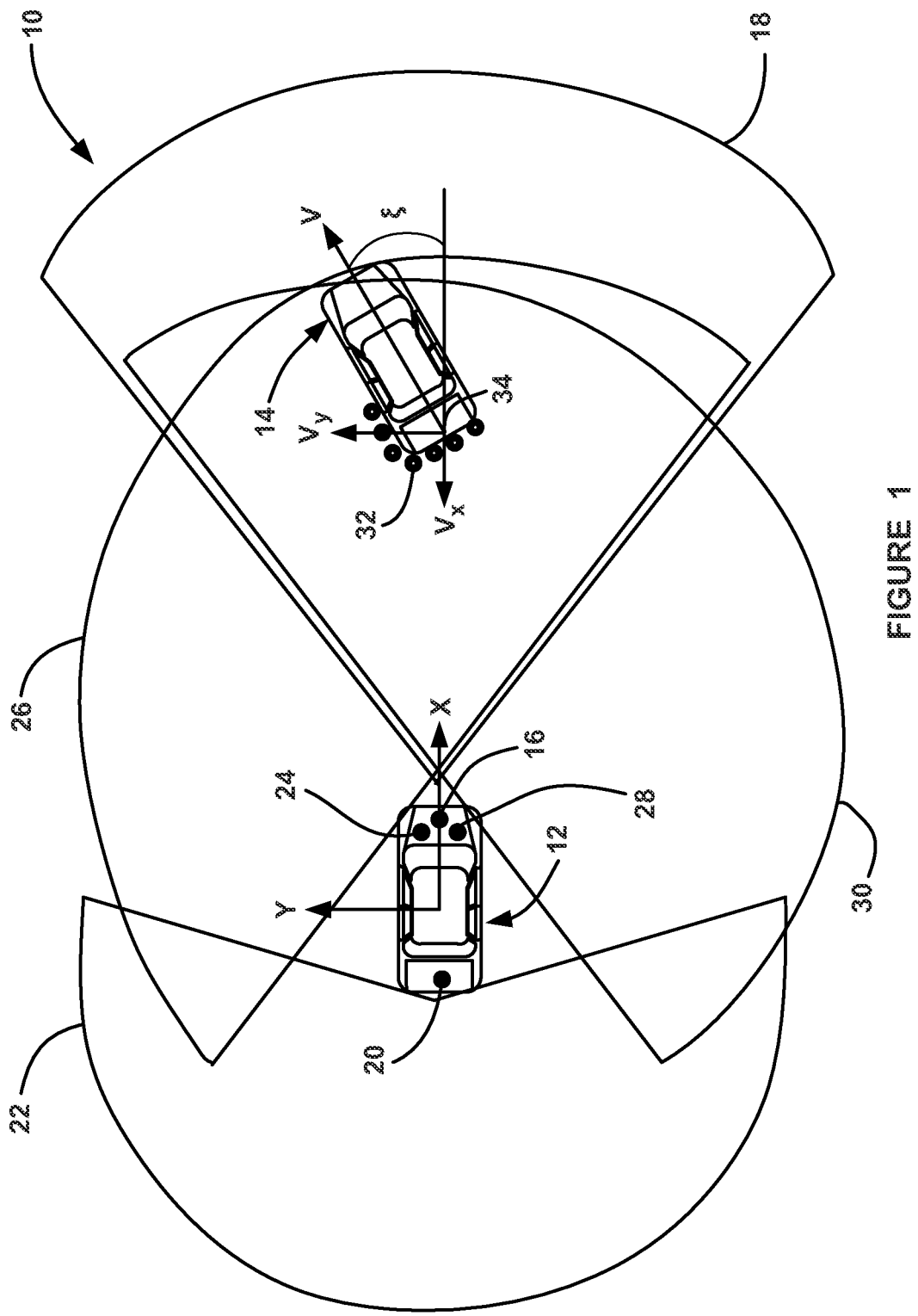
FIG. 1 is an illustration of a host vehicle following a target vehicle and showing the fields-of-view of four LiDAR sensors on the host vehicle.

FIG. 1 illustrates an overview of a vehicle system 10 including a host vehicle 12 shown trailing a target vehicle 14 that it is tracking. The host vehicle 12 includes four LiDAR sensors, namely, a forward looking sensor 16 having a field-of-view 18, a rearward looking sensor 20 having a field-of-view 22, a left looking sensor 24 having a field-of-view 26 and a right looking sensor 28 having a field-of-view 30. The sensors 16, 24 and 28 are mounted at the front of the vehicle 12 and have over-lapping fields-of-view, as shown. If an object, such as the target vehicle 14, is in the field-of-view of a particular one of the sensors 16, 20, 24 and 30, the sensor returns a number of scan points that identifies the object. Points 32 on the target vehicle 14 represent the scan points that are returned from the target vehicle 14 from each of the sensors 16, 24 and 28. The points 32 are transferred into the vehicle coordinate system (x, y) on the host vehicle 12 using a coordinate transfer technique, and then the object detection is performed in the vehicle coordinate system using the points 32. The points 32 can be used to define a rear shape of the target vehicle 14, as discussed below.

Each sensor 16, 20, 24 and 28 will provide a scan point cloud for each separate object detected by the sensor. The present invention proposes a fusion algorithm that combines the outputs from each of the sensors 16, 20, 24 and 28 so that as the sensors 16, 20, 24 and 28 track the same object that object is processed as a single target, where the algorithm outputs the position, orientation and velocity of each tracked object. Although this discussion includes four LiDAR sensors, the proposed fusion algorithm will be applicable for any number and position of multiple LiDAR sensors having overlapping field-of-views.

The position of the target vehicle 14 is represented in this diagram by an anchor point 34, namely, the center of the scan map. The following values are used to represent an object model M of the target vehicle 14 at time step t. Particularly, the object model M defines the relative longitudinal speed $V_x$, the relative lateral speed $V_y$, the lateral displacement y, and the target vehicle heading $\xi$, or direction of the target's ground speed vector. The value M is a list of Gaussian components represented by the parameters mean $m_j$ and variance $\sigma^2$. The mean is characterized by several hyper-parameters $v_j$, $\eta_j$, $k_j$, and flags, i.e., visited and matured.

Figure 2:
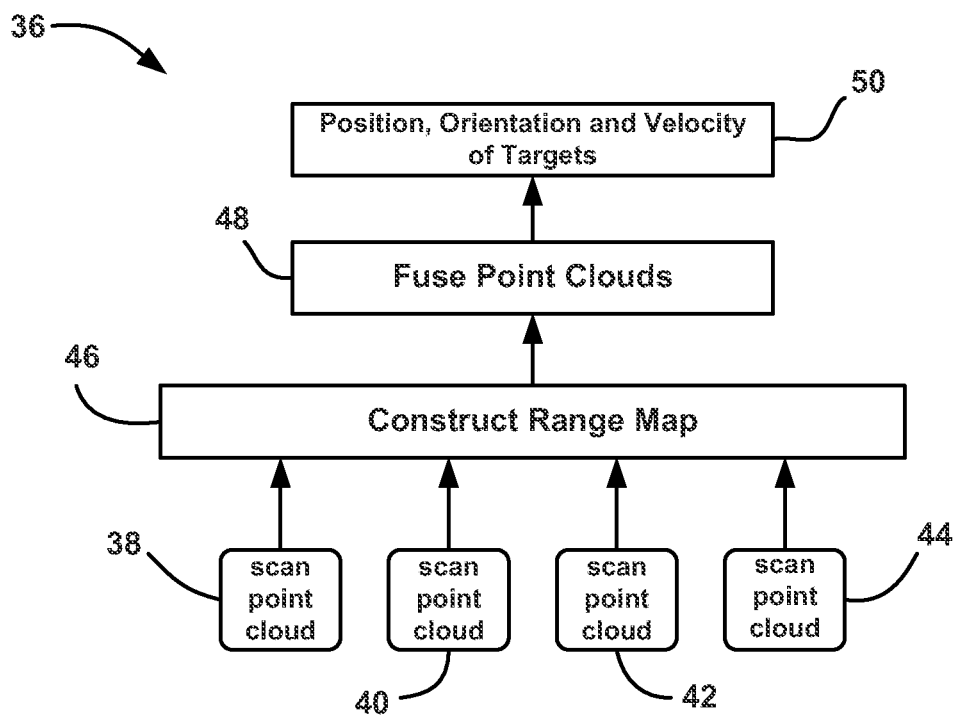
FIG. 2 is a general block diagram of a fusion system for fusing scan points from multiple LiDAR sensors on a vehicle.

FIG. 2 is a schematic block diagram of a fusion system 36 for fusing scan point cloud returns from multiple LiDAR sensors, such as the sensors 16, 20, 24 and 28. Box 38 represents the scan point cloud return from the left LiDAR sensor 24, box 40 represents the scan point cloud return from the right looking LiDAR sensor 28, box 42 represents the scan point cloud return from the forward looking LiDAR sensor 16, and box 44 represents the scan point cloud return from the rearward looking LiDAR sensor 20. The range maps from the LiDAR sensors 16, 20, 24 and 28 are registered and a 360° range map (point cloud) is constructed at box 46. Once the point clouds from the sensors 16, 20, 24 and 28 are registered and a 360° point cloud is formed in the vehicle coordinates, the algorithm fuses the point clouds from the multiple targets at box 48, discussed in detail below. After the targets are fused in the vehicle coordinate frame, the algorithm outputs the position, orientation and velocity of the targets at box 50.

Before the fusion process for combining the scan points from multiple LiDAR sensors is specifically discussed, a discussion of a scan point registration algorithm performed at the box 46 is provided to estimate the motion of the object if the object model M and current scan map S corresponding to the object are available.

In many vehicles, the object detection sensors are integrated directly into the front fascia of the vehicle. This type of installation is simple, effective, and aesthetically pleasing, but has the disadvantage that there is no practical way to physically adjust the alignment of the sensors. Thus, if a sensor becomes misaligned with the vehicle's true heading, due to damage to the fascia or age and weather-related warping, there has traditionally been no way to correct the misalignment, other than to replace the entire fascia assembly containing the sensors.

As will be discussed below, the frame registration performed at the box 46 matches the range scan points from the sensors 20, 24 and 28 to accommodate possible drift in the position and orientation of the sensors 20, 24 and 28. The sensors 20, 24 and 28 are initially calibrated when the vehicle 12 is new. As mentioned, various factors cause those orientations to change over time, and thus, a process needs to be implemented to recalibrate the sensor orientation so that objects detected in the over-lapping portion of the field-of-views 26 and 30 is more accurate. The present invention proposes an expectation-maximization (EM) matching algorithm to find a transformation T between multiple LiDAR sensors that defines an orientation angle and the x and y position of the sensors. For example, the algorithm will match the transformation T from the left looking LiDAR sensor 24 to the right looking LiDAR sensor 28, and when transformations T from subsequent calculations match, the sensors 24 and 28 will be aligned.

Figure 3:
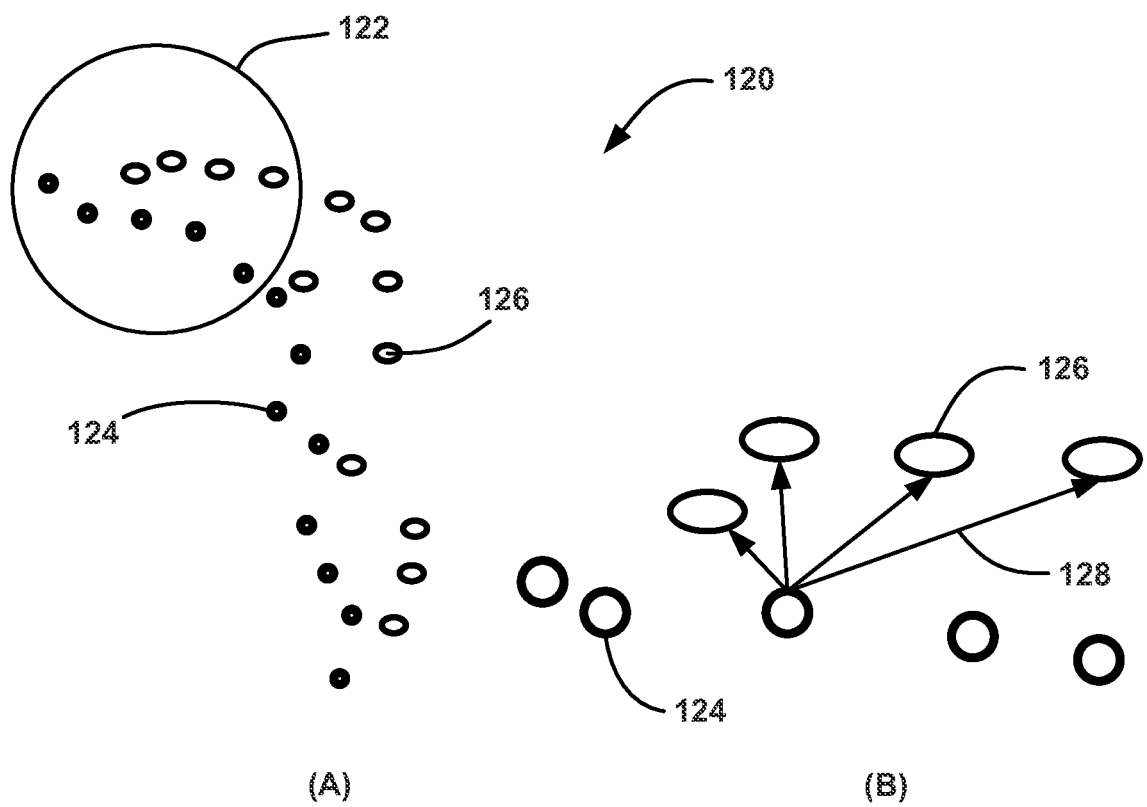
FIGS. 3(A) and (B) show scan points from a LiDAR sensor.

The EM algorithm begins by choosing an initial transformation value $T_0$, which could be zero, a previously estimated value, an orientation between the sensors 24 and 28 provided by the manufacturer, etc. The algorithm then projects a left sensor range map using the transformation T to the frame for the right looking LiDAR sensor 28. FIG. 3 is a representation of a scan point map 120 where circles 124 represent scan point returns from the left LiDAR sensor 24 and ovals 126 represent scan point returns from the right looking LiDAR sensor 28. FIG. 3(A) shows all of the scan point returns and FIG. 3(B) shows an enlarged area in the circle 122 for a few of the scan point returns. FIG. 3(B) shows how the left looking LiDAR sensor scan point returns 124 are mapped to the right looking LiDAR sensor scan point returns 126 by arrows 128. By using the currently available transformation T for the projection map arrows 128, the left looking LiDAR sensor scan point returns 124 are moved relative to the right looking LiDAR sensor scan point returns 126 in an attempt to make them overlap.

The transformation T currently being used may not be accurate for the present orientation of the left looking LiDAR sensor 24 to the right looking LiDAR sensor 28 so that the transformation T needs to be updated for the current position of the sensors 24 and 28. The algorithm uses the current transformation T to update a weight $a_{jk}$ between the left sensor scan point $s_j$ and the right sensor scan point $m_k$ as:

$$a_{jk} = \frac{K(\|s_j - T \circ m_k\|)}{\sum_k K(\|s_j - T \circ m_k\|)}, \quad (1)$$

where the kernel function K is:

$$K(x) = \frac{1}{\sigma\sqrt{2\pi}} e^{-\frac{x^2}{2\sigma^2}}. \quad (2)$$

A new transformation T' is then determined using the revised weight $a_{jk}$ as:

$$T' = \mathrm{argmin}_T = \frac{1}{2} \sum_{j,k} a_{jk} \log K(\|s_j - T \circ m_k\|). \quad (3)$$

The new transformation T' is then compared to the previously calculated transformation T, and based on the difference therebetween, the weight $a_{jk}$ is recalculated using the new transformation T' until the newly calculated transformation T' matches the previously calculated transformation T, where the sensors 24 and 28 are aligned.

In certain cases, the transformation T to align the scan data points will be sufficiently large where it may be beneficial to enhance the solution of T' in equation (3). For this example, the transformation T is defined as x'=T·x, where x'=Rx+t, and where R is a rotation matrix and t is a translation vector. In this analysis, let:

$$S = [S_1, S_2, \ldots, S_L]^T, \quad (4)$$

$$M = [m_1, m_2, \ldots, m_N]^T, \quad (5)$$

$$A = [a_{jk}], \quad (6)$$

$$1 = [1, 1, \ldots, 1]^T, \quad (7)$$

$$\mu_s = \frac{1}{L} S^T A^T 1, \quad (8)$$

$$\mu_m = \frac{1}{N} M^T A 1, \quad (9)$$

$$\hat{S} = S - 1\mu_s^T, \quad (10)$$

$$\hat{M} = M - 1\mu_m^T. \quad (11)$$

The solution of the new transformation T' in equation (3) is then given by:

$$T' = [R', t'], \quad (12)$$

where:

$$R' = UCV, \quad (13)$$

$$t' = \mu_s - R'\mu_m, \quad (14)$$

and where U and V are defined as the factors of a singular value decomposition of:

$$USV = svd(\hat{S}^T A^T \hat{M}), \quad (15)$$

and C is:

$$C = \begin{bmatrix} 1 & 0 \\ 0 & \det(UV^T) \end{bmatrix}. \quad (16)$$

The above described EM algorithm for determining the transformation T may be only locally optimal and sensitive to the initial transformation value. The algorithm can be enhanced using particle swarm optimization (PSO) to find the initial transformation $T_0$. In this optimization, let E be the set of eligible transformations T from the left LiDAR sensor 24 to the right LiDAR sensor 28. The algorithm randomly generates N particles $\{t_i/t_i \in E\}$ according to the uniform distribution in the eligible transformation E, and each particle $t_i$ is associated with a normalized weight $w_i=1/N$. For each particle $t_i$, the EM algorithm is set to the best transformation $T_i$, where $t_i$ is given as the initial value. Let the weight $w_i$ be the percentage of the match between the two scans for the transformation $T_i$. The algorithm then outputs the transformation $T_k$ with the best match percentage as the nominal value for the transformation from the left LiDAR sensor 24 to the right LiDAR sensor 28, where $w_k = \max(w_i)$.

In most cases, the change in the transformation T from one sample time to the next will typically be small, and therefore, it is not necessary to use the computationally intensive process of calculating the new transformation T' for large changes in the transformation T described above. Particularly, if the nominal transformation $T_n$ is estimated from the PSO algorithm above, the new estimation of the transformation T can be recursively refined using the following lowcomputational EM matching algorithm. First, the transformation $T_n$ is applied to every scan point of the right LiDAR sensor 28 as:

$$S_j \leftarrow T_n \circ S_j. \quad (17)$$

The corrected transformation $\Delta T$ is determined as:

$$\Delta T: x' = \Delta T \circ x, \quad (18)$$

and defined as:

$$x' = x - \epsilon y + t_x, \quad (19)$$

$$y' = \epsilon x + y + t_y, \quad (20)$$

where the transformation $\Delta T$ is modeled as $(t_x, t_y, \epsilon)$, and where the previous transformation $\Delta T_o$ is $(t_{xo}, t_{yo}, \epsilon_o)$.

Equation (3) is then replaced with:

$$T' = \operatorname{argmin}_T -\frac{1}{2} \sum_{j,k} a_{j,k} \log K(\|S_j - T \circ m_k\|) + \lambda \|\Delta T - \Delta T_o\|^2, \quad (21)$$

and the solution is:

$$t'_x = \frac{\sum_{j,k} a_{jk}(x'_j + \varepsilon y_k - x_k) + \lambda t_{x0}}{\sum_{j,k} a_{jk} + \lambda}, \quad (22)$$

where:

$$s_j = (x'_j, y'_j), \quad (23)$$

$$m_k = (x_k, y_k), \quad (24)$$

$$T' = t'_x, t'_y, \mathcal{E}', \quad (25)$$

$$t'_y = \frac{\sum_{j,k} a_{jk}(y'_j - \varepsilon x_k - y_k) + \lambda t_{y0}}{\sum_{j,k} a_{jk} + \lambda}, \quad (26)$$

$$\mathcal{E}' = \frac{\sum_{j,k} a_{jk}[(y'_j - t'_y - y_k)x_k - (x'_j - t'_x - x_k)y_k] + \lambda \varepsilon_0}{\sum_{j,k} a_{jk}(x_k^2 + y_k^2) + \lambda}, \quad (27)$$

and where $\lambda$ is a weight factor that can be tuned for how much the previous estimation is used.

Figure 4:
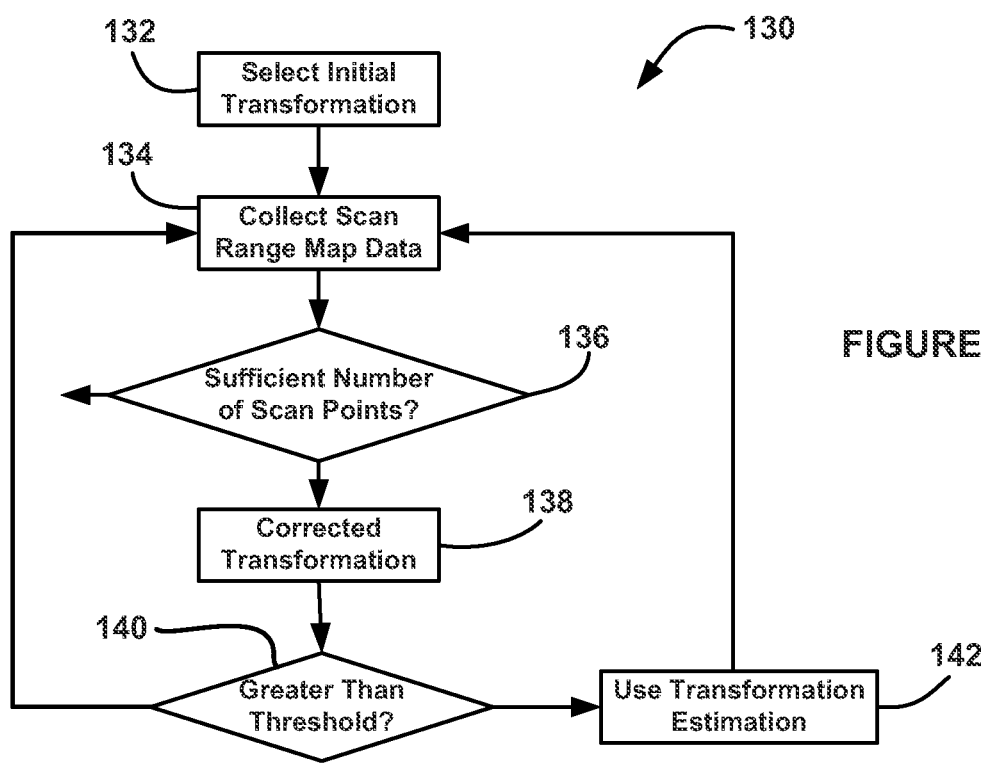
FIG. 4 is a flow chart diagram showing a method for registering scan points from multiple LiDAR sensors.

FIG. 4 is a flow chart diagram 130 showing the operation for aligning the LiDAR sensors, for example, the LiDAR sensors 24 and 28, as discussed above. At box 132, the algorithm selects the initial transformation $T_n$, such as the manufacturer setting. At box 134, the algorithm collects the scan range map data from the LiDAR sensors 24 and 28, and determines if there is a sufficient number of scan points from an object in the field-of-view of the LiDAR sensors 24 and 28 to adequately perform the calculations at decision diamond 136. If there is not enough scan points, then the algorithm returns to the box 134 to collect more range map data. If there is enough scan points at the decision diamond 136, then the algorithm uses the EM matching algorithm to find the corrected transformation $\Delta T$ at box 138. The algorithm then determines whether the corrected transformation $\Delta T$ is greater than a predetermined threshold at decision diamond 140, and if so, the large transformation estimation is employed using the PSO algorithm to find the new nominal transformation $T_n$ at box 142. If the matching percentage is not greater than the threshold at the decision diamond 140, then the algorithm returns to the box 134 to collect the next scan points.

Returning to the fusion algorithm, the discussion below first presents a proposed scan point registration algorithm that estimates the motion of the target vehicle 14 if the object model M and the current scan map S corresponding to the target vehicle 14 are given. The discussion above concerning the EM algorithm for determining the transformation T that aligns the frames between the LiDAR sensors provides spatial matching, particularly, matching between two frames from different LiDAR sensors at the same time. This discussion concerning scan point registration also uses a point set registration algorithm to find the transformation T that matches two frames temporally between the current scan map S and the object model M derived from the past scan maps.

Figure 5:
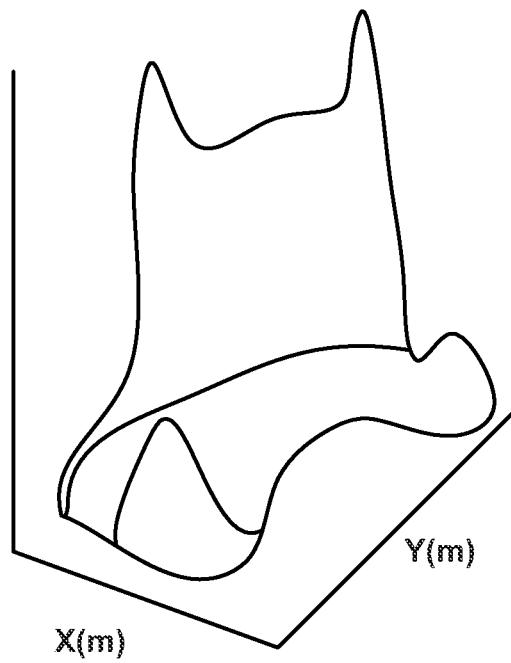
FIG. 5 is a contour probability density function of the rear of an object.

A probabilistic object model M is first defined, and then a proposed iterative algorithm is provided to find a rigid transformation such that the likelihood is maximized, given the scan maps of the subsequence frame. To characterize the geometric shape of an object, a contour probability density function (PDF) in sample space $\mathbb{R}^2$ is defined. FIG. 5 shows a snapshot of an example PDF for the rear of the target vehicle 14. Rather than using certain parameters, the PDF is directly represented by a list of particles (dots), denoted as $M = (m_1, m_2, \ldots, m_{n_M})^T$.

This non-parametric way of representing the PDF can be written as:

$$p(x; M) = \frac{1}{n_M} \sum_{j=1}^{n_M} K_\sigma(x - m_j), \quad (28)$$

where $x \in \mathbb{R}^2$, $$K_\sigma(x) = \frac{1}{n_M} \exp\left(\frac{\|x\|^2}{2\sigma^2}\right)$$

is a Gaussian kernel function, and $\sigma > 0$ is a smoothing parameter referred to as the bandwidth, or the size of a Parzen window.

Let y be the parameters of the transformation $T_y$. The operators are defined as a transformation operator $T_y(\bullet)$ with parameters y and the corresponding inverse transformation $T_y^{-1}(\bullet)$. Without loss of generality, the object model M can be considered as centered at the origin 34. In the subsequent frame, an object at location y is characterized by the PDF:

$$p(x; y, M) = \frac{1}{n_M} \sum_{j=1}^{n_M} K_\sigma(T_y^{-1}(x) - m_j). \quad (29)$$

Let $S = (s_1, s_2, \ldots, s_{ns})^T$ be the current scan map that consists of a list of scan points $s_k$. The likelihood function can be expressed by:

$$L(S; y, M) = \Pi_{k=1}^{n_s} p(T_y^{-1}(s_k); M), \quad (30)$$

where scan points $s_k$ are assumed to be independent and identical distributed samples of the object model M at location y.

The objective here is to find the maximum of $L(S; y, M)$ with respect to the transformation parameters y, which is equivalent to finding the minimum of $J(y; M) \equiv -\log L(S; y, M)$ as:

$$y^* = \text{argmin}_y J(y; M), \quad (31)$$

where:

$$J(y; M) = \sum_{k=1}^{n_s} -\log\left(\frac{1}{n_M}\sum_{j=1}^{n_M} K_\sigma(T_y^{-1}(s_k) - m_j)\right). \quad (32)$$

This local minimum indicates the presence of the object in the following frame having a representation similar to p(x; M) defined at the origin 34.

An auxiliary matrix $A \equiv \{a_{kj}\}$ with $a_{kj} \geq 0$ for $j=1, \ldots, n_M$ and $k=1, \ldots, n_s$ is introduced, where:

$$\Sigma_{j=1}^{n_m} a_{kj} = 1, \quad (33)$$

for all k.

Thus, equation (32) becomes:

$$J(y; M) = \sum_{k=1}^{n_s} -\log\left(\sum_{j=1}^{n_M} a_{kj} \frac{K_\sigma(T_y^{-1}(s_k) - m_j)}{a_{kj}}\right), \quad (34)$$

$$\leq -\sum_{k,j} a_{kj} \log \frac{k_\sigma(T_y^{-1}(s_k) - m_j)}{a_{kj}}, \quad (35)$$

$$\equiv \mathcal{J}(A, y; M). \quad (36)$$

In equation (32), the normalization factor $$\frac{1}{n_M}$$

is absorbed into a constant term that is neglected. Equation (36) follows when applying Jensen's inequality to equation (34).

Provided that the negative logarithm function is convex, the best upper bound $\mathcal{J}^*(y; M)$ for equation (36) can be derived by taking the derivative of the expression of equation (36) and the Lagrange multiplier of the constraint, see equation (33), with respect to $a_{kj}$, and setting to zero. The optimal auxiliary variable can be expressed by:

$$a_{kj} = \frac{K_\sigma(T_y^{-1}(s_k) - m_j)}{\sum_{j'=1}^{n_M} K_\sigma(T_y^{-1}(s_k) - m_{j'})}, \quad (37)$$

for $j=1, \ldots, n_M$ and $k=1, \ldots, n_s$.

Therefore, equation (31) can be iteratively solved by "bound optimization," which is alternating between optimizing $\mathcal{J}^*(y_1; M)$ with respect to the auxiliary matrix A, the parameters y of the transformation T, and the bandwidth of the kernel function σ.

Figure 6:
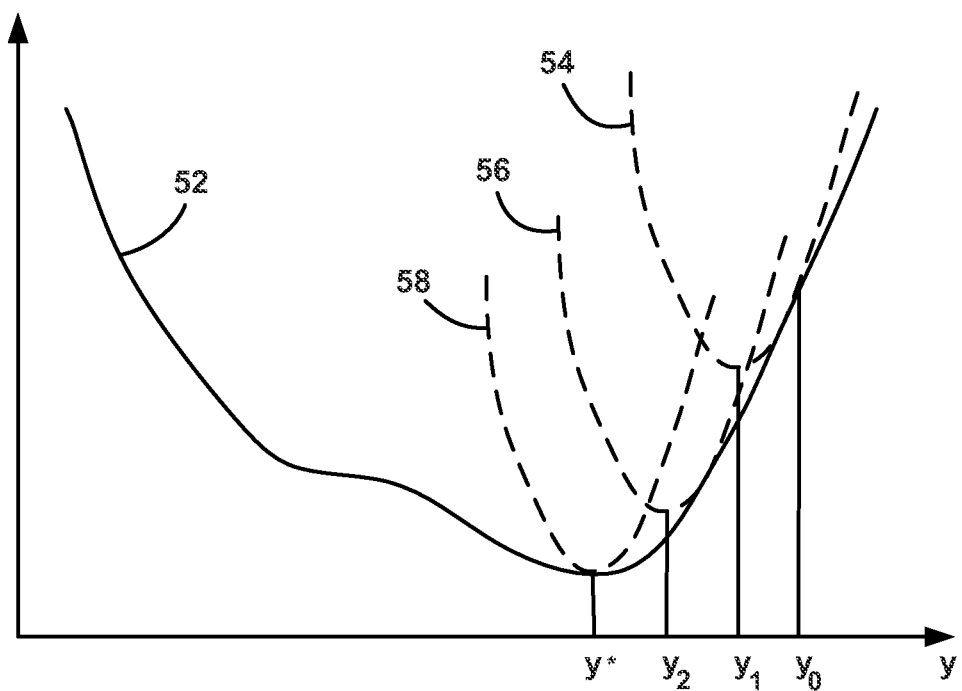
FIG. 6 is an iterative bound optimization graph.

FIG. 6 is a graph with y on the horizontal axis showing the iterative bound optimization relationship, where line 52 is the complicate curve J(y;M), and the dashed curves are successive upper bounds at $y_o$, $y_1$ and $y_2$, namely, graph line 54 is $\mathcal{J}^*(y_2;M)$, graph line 56 is $\mathcal{J}^*(y_1;M)$ and graph line 58 is $\mathcal{J}^*(y_1;M)$, respectively.

The iterative procedure shown in Algorithm 1 below is repeated until convergence, i.e., the difference of the estimated y in two iterations is less than a predetermined small number. Empirical results show that 2-3 epochs of iteration is sufficient for the proposed algorithm to converge.

Algorithm 1: Scan Point Registration

Input: Object model M, current scan map S, and initial transformation parameter $y_0$.

1) Let σ=$σ_0$, where $σ_0$ is a positive number.

2) Computing A: Given the previous estimate of the transformation parameter $y_n$, $a_{kj}$ is updated using equation (37).

3) Minimizing $\mathcal{J}(y;M)$: Compute y* to minimizing $\mathcal{J}^*(y; M)$, i.e.:

$$y^* = \text{arg min}_y - \Sigma_{k,j} a_{kj} \log K_\sigma(T_y^{-1}(s_k) - m_j). \quad (38)$$

4) Computing σ: Different equation (36) with respect to σ, setting the derivative to zero, gives:

$$\sigma^2 = \frac{1}{n_s}\sum_{k,j} a_{kj} \|T_{y^*}^{-1}(s_k) - m_j\|^2. \quad (39)$$

5) Let $y_{n+1} = y^*$. If $\|y_{n+1} - y_n\| > \epsilon$, then go to step 2. Otherwise output y* is used as the estimated parameters for the transformation.

The following discussion describes a special case of point set registration that can be used in robotics with LiDAR scanners. A rigid transformation $x' = T_y(x)$ and $x' = Rx + t$ can be written where the parameter vector y consists of the rotation matrix R and the translation vector t. Equation (38) can be simplified as:

$$y^* = \text{arg min}_y \Sigma_{k,j} a_{kj} \|s_k - Rm_j - t\|^2, \quad (40)$$

such that det(R)=1 and $R^T R = I$.

Taking the partial derivative of equation (40) with respect to t and R, respectively, equation (40) can be solved. To show the solution, the following quantities are defined:

$$\mu_s = \frac{1}{n_s} S^T A^T 1, \quad (41)$$

$$\mu_m = \frac{1}{n_m} M^T A 1, \quad (42)$$

$$\hat{S} = S - 1\mu_s^T, \quad (43)$$

$$\hat{M} = M - 1\mu_m^T, \quad (44)$$

where $1 = [1, 1, \ldots, 1]^T$.

The solution of equation (40) is:

$$R = UCV^T, \quad (45)$$

$$t = \mu_s - R\mu_m, \quad (46)$$

where U and V are defined as the factors of singular value decomposition, i.e., $USV^T = \text{svd}(\hat{S}^T A^T \hat{M})$ and $C = \text{diag}(1, \det(UV^T))$.

The discussion below proposes a Bayesian-based algorithm that recursively estimates the motion and updates of the object model M. Let $S_0, \ldots, S_t$, and $S_{t+1}$ be the scan maps sampled from a dynamic object at time steps $0, \ldots, t$, and $t+1$, respectively.

Figure 7:
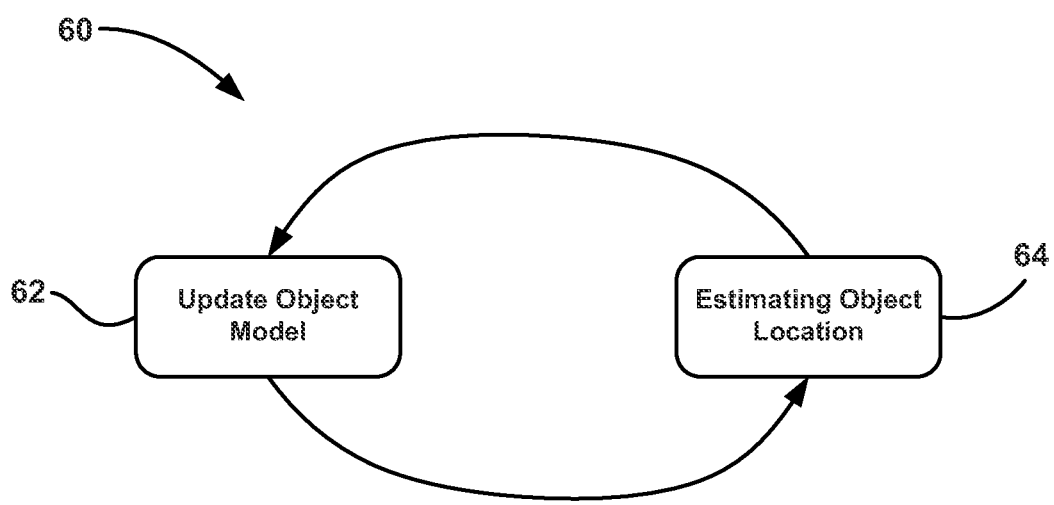
FIG. 7 is a block diagram showing two interweaved processes for estimating object motion and updating an object model when a new LiDAR scan point map is available.

FIG. 7 shows that tracking can be treated as i) a problem of estimating the motion of the object, and ii) a problem of updating the object model M when a new frame scan map is received. Particularly, FIG. 7 shows a process 60 for estimating an object location at box 64, using the object location to update an object model at box 62 and estimating the object location when a new scan map is available.

The discussion below will include reference to bipartite graphs and Bayesian graphs. These two types of graphs include nodes that represent different things. The nodes in a Bayesian graph represent variables to be estimated, such as the transformation T and the object model M, which are random, and can only be represented by a PDF. These nodes are arranged in a sequence across different time frames, and each sequence only models an object. Contrary, the nodes in the bipartite graphs are segmentations of scan maps. Each scan map may contain multiple objects at the same time frame. Thus, the objective is to find the segments with each corresponding to an object. Building the associating of the segments $(s_1, s_2, \ldots, s_n)$ along the time axis, multiple sequences can be obtained, with each corresponding to an object. In this way, the bipartite graphs can be used to apply the Bayesian method to track each individual object.

Figure 8:
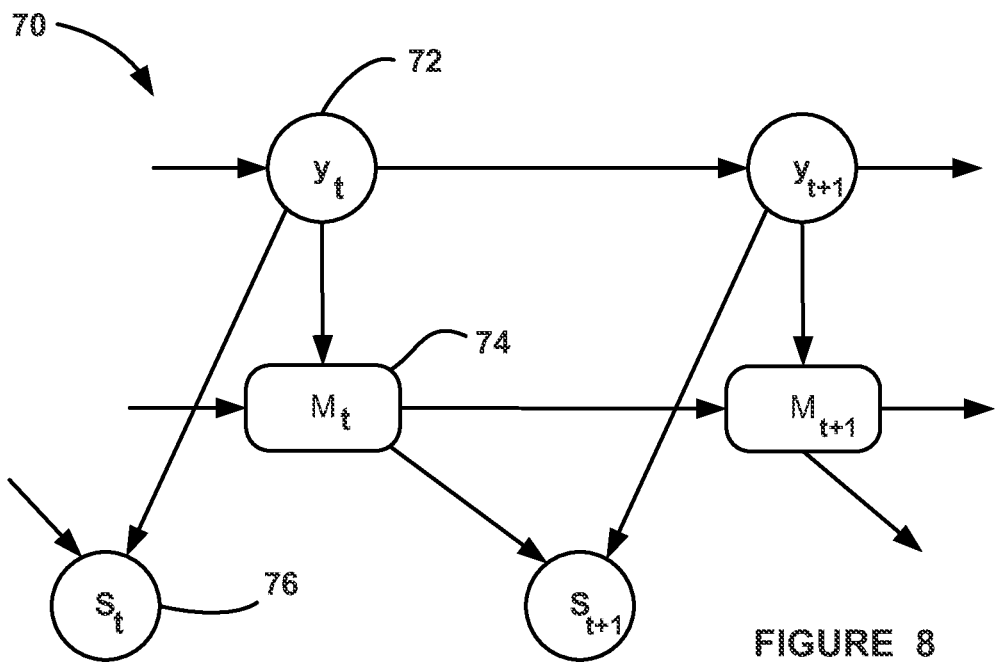
FIG. 8 is a dynamic Bayesian network for an object being tracked by a tracking algorithm.

FIG. 8 illustrates a dynamic Bayesian network 70 representing two time steps of the proposed tracking algorithm. In the network 70, nodes 72 represent the transformation parameters $y_t$ and $y_{t+1}$, i.e., the object position and attitude of the targets, nodes 74 represent the object models $M_t$ and $M_{t+1}$ and nodes 76 represent the scan maps $S_t$ and $S_{t+1}$. In FIG. 8, $y_t$ and $y_{t+1}$ are estimated parameters of the transformation at time steps t and t+1, respectively, and $M_t$ and $M_{t+1}$ are the object models at time steps t and t+1, respectively. In order to adapt to the Bayesian network 70, p(y) is modeled as a Dirac delta distribution parameterized by its center $\bar{y}$, and the object model M as the joint PDF of Gaussian components parameterized by their mean $\{m_j\}$ and a fixed variance $\sigma^2$, respectively. Each mean $m_j$ is represented by a Gaussian PDF with hyper-parameters, namely, the mean and variance $$\left(v_j, \frac{\sigma^2}{\eta_j}\right).$$

The discussion below details updating rules for the parameter $\bar{y}$ and the hyper-parameters $\{v_j, \eta_j / j=1, \ldots, n_M\}$. Using Bayes and chain rules, respectively, the posterior PDF is written given sets of scan maps up to time t+1 as:

$$p(y,M|S^{(0:t+1)}) \propto p(S|y,M)p(y,M|S^{(0:t)}) = p(S|y,M)p(y|S^{(0:t)})p(M|S^{(0:t)}), \quad (47)$$

where y and M are $y_{t+1}$ in short, $S^{(0:t+1)}$ represents scan maps up to time step t+1, S is the scan map at time t+1, p(S|y, M) is an equivalent representation of L(S; y, M) in equation (30), and the last equality follows by assuming conditional independence given $S^{(0:t)}$.

In equation (47), $p(y|S^{(0:t)})$ is the prior PDF of parameter y at time step t–1, given previous scan maps $S^{(0:t)}$, which can be computed as:

$$p(y|S^{(0:t)}) = \int p(y|y_t)p(y_t|S^{(0:t)})dy_t. \quad (48)$$

In equation (48), $p(y_t|S^{(0:t)})$ denotes the posterior PDF for transformation parameter at time t, and $p(y|y_t)$ is the conditional probability of the following plant model of the object motion:

$$y = f(y_t) + w, \quad (49)$$

where w is a zero-mean Gaussian random variable with covariance matrix Q (i.e., $p(w) = \mathcal{N}(w|0, Q)$). If $p(y_t|S^{(0:t)})$ is assumed to be Dirac Delta distribution centered at $\bar{y}_t$, the prior PDF at time step t=1 can be written as:

$$p(y|S^{(0:t)}) = \mathcal{N}(y|\tilde{y}, Q), \quad (50)$$

where $\tilde{y}$ is the predicted value of the following plant model of the object $\tilde{y} = f(\bar{y}t)$.

The expression $p(M_{t-1}|S^{(0:t)})$ can be modeled as the conjugate distribution family of L(S; y, M) in equation (30) to yield a trackable posterior PDF. A product of Gaussian densities with known variance $\sigma^2$ is proposed as:

$$p(M_{t-1}|S^{(0:t)}) = \Pi_j \mathcal{N}\left(m_j | v_j, \frac{\sigma^2}{\eta_j}\right), \quad (51)$$

where:

$$\mathcal{N}\left(m_j | v_j \frac{\sigma^2}{\eta_j}\right) = c(\eta_j) \exp^{-\frac{\eta_j}{2\sigma^2}\|m_j - v_j\|^2}, \quad (52)$$

and where $(\eta_j, v_j)$ are the hyper-parameters of the prior PDF for the j-th component of $M_{t-1}$, and $c(\eta_j)$ is a normalizing factor.

As shown in FIG. 8, the prior data for the object model M at time step t is:

$$p(M|S^{(0:t)}) = p(M|y_t, M_{t-1}) = \Pi_j \mathcal{N}\left(m_j | T_{\bar{y}t}(v_j), \frac{\sigma^2}{\eta_j}\right). \quad (53)$$

Now consider the problem of estimating the posterior p(y, M|$S^{(0:t+1)}$) at time t+1. Since y and M are conditionally independent, i.e.:

$$p(y,M|S^{(0:t+1)}) = p(y|S^{(0:t+1)})p(M|S^{(0:t+1)}), \quad (54)$$

the posterior regarding y and M can be estimated separately as the following two steps.

Assume $p(y|S^{(0:t+1)})$ is the Dirac delta PDF centered at $\bar{y}_{t+1}$, which can be estimated by maximizing equation (47) with respect to y. Plugging equation (50) into equation (47), applying a negative logarithm to equation (47) and neglecting terms irrelevant to y gives:

$$\bar{y}_{t+1} = \arg\min_y -\Sigma_{k,j} a_{kj} \log K_\sigma(T_y^{-1}(s_k) - m_j) + \|y - \tilde{y}\|_Q^2, \quad (55)$$

where $m_j = T_{\bar{y}_t}(v_y)$ and $\|x\|_Q^2 = x^T Q^{-1} x$. Therefore, equation (38) can be replaced with equation (55) for integrating prior information of previous time steps, and then apply Algorithm 1 to derive $\bar{y}_{t+1}$.

Neglecting terms irrelevant to the object model M, the negative logarithm of equation (47) can be written as:

$$J(M) = -\log p(S|y, M) - \log p(M|S^{(0:t)}) \leq \quad (56)$$

$$\mathcal{J}^*(\bar{y}_{t+1}, M) - \sum_j \mathcal{N}\left(m_j | T_{\bar{y}_t}(v_j), \frac{\sigma^2}{\eta_j}\right).$$

Note that equation (56) is the best upper bound of J(M) for all possible values of y.

As in FIG. 6, the bound optimization can be used to iteratively find the optimal object model M by finding the minimum of the above upper bound function. Setting the derivatives of equation (56) with respective to the object model M to zero, the MAP estimate of the object model M can be obtained as:

$$m_j^* = \frac{\rho_j T_{\bar{y}_{t+1}}^{-1}(\bar{s}_j) + \eta_j T_{\bar{y}_t}(v_j)}{\rho_j + \eta_j}, \quad (57)$$

where:

-continued $$\rho_j = \sum_k a_{kj}, \quad (58)$$

$$\bar{s}_j = \sum_k a_{kj} s_k / \rho_j. \quad (59)$$

The updating rules of the new hyper-parameters ($\eta_j'$, $v_j'$) for the posterior distribution of the object model M, after S at time t+1, can be written as:

$$\eta_j' = \eta_j + \rho_j, \quad (60)$$

$$v_j' = \frac{1}{\eta_j + \rho_j}(\eta_j T_{\bar{y}_t}(v_j) + \rho_j T_{\bar{y}_{t+1}}^{-1}(\bar{s}_j)). \quad (61)$$

Therefore, the posterior PDF of the target at time t is:

$$p(M \mid S^{(0:t+1)}) = \Pi_j \mathcal{N}\left(m_j \mid v_j', \frac{\sigma^2}{\eta_j'}\right). \quad (62)$$

Note that $m_j^*$ in equation (57) is the mode and $v_j'$ in equation (61) is the mean of the j-th component (particle) of the object model M. They are identical because of the Gaussian assumption.

The recursive tracking and model update method is summarized in Algorithm 2 below. Step 1 prepares the object model M for the current time frame, whereas Step 2 estimates the motion of the object model M. Step 3 updates the object model M based on the current scan map. Step 4 adds new particles into the object model M, whereas Step 5 removes outliers from the object model M.

Algorithm 2: Tracking and object model updating
Input: Current scan map $S_{t+1}$, object model $M_{t-1}=\{v_j, \eta_j\}$, and transformation $\bar{y}_t$.
Output: Estimated $\bar{y}_{t+1}$ and updated $M_t$.

1) Compute the hyper-parameters ($T_{\bar{y}_t}(v_j), \eta_j$), for all j, of $p(M_t|S^{(0:t)})$ in equation (51). Set all particles as unvisited.

2) Let $m_j = T_{\bar{y}_t}(v_j)$ for all j. Replace equation (38) with equation (55) and then run Algorithm 1 to obtain $\bar{y}_{t+1}$ and $A_{t+1}$.

3) If $\rho_j = \Sigma_k a_{kj}$ is larger than a threshold, compute the hyper-parameters using equations (60) and (61), set the particle as visited, and increase the visiting count $K_j$ by 1. If $K_j > 5$, the j-th particle is marked as mature.

4) Compute $Q_k = \Sigma_j a_{kj}$ for all k. If a $Q_k$ is less than a threshold, add a new particle $s_k$ with the following values $K_k = 1$, $v_k = s_k$, $\eta_k = 1$, and marked as visited.

5) Remove particles not marked as visited and not mature.

Figure 9:
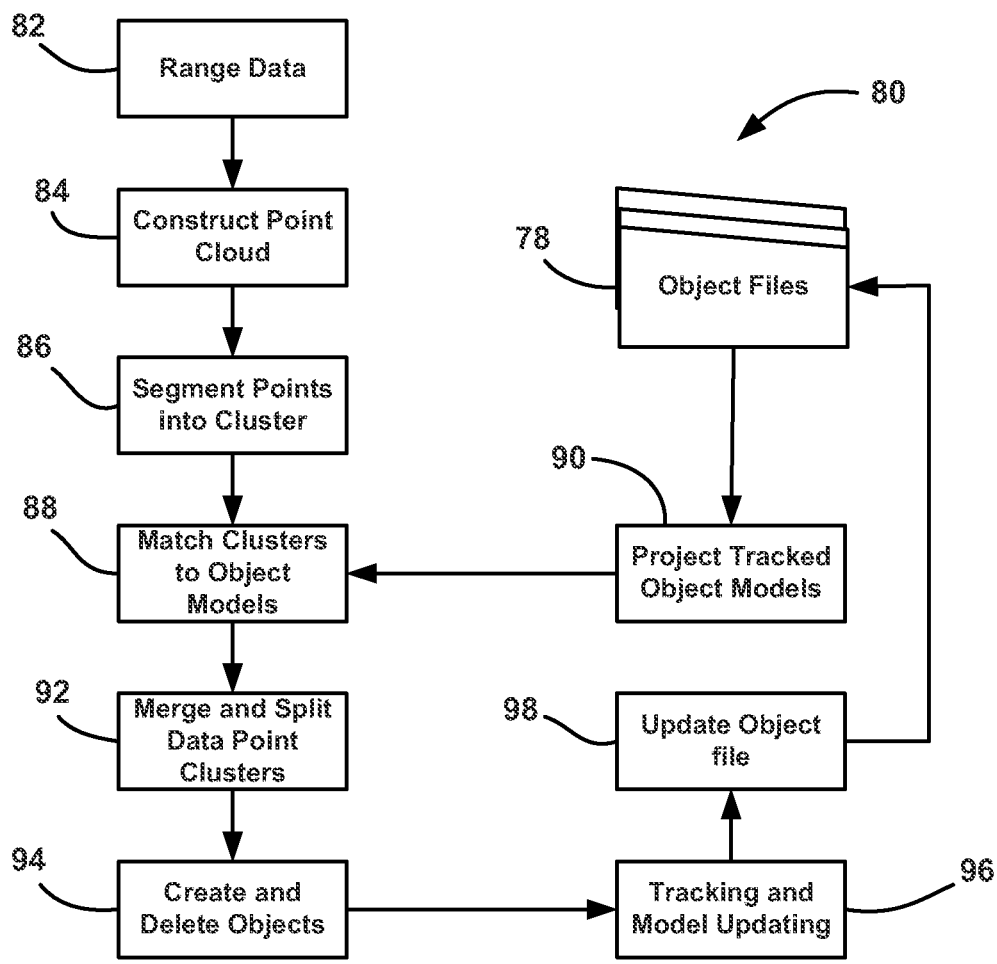
FIG. 9 is a flow chart diagram showing a process for a multi-object tracking algorithm at a single time step.

FIG. 9 is a flow diagram 80 showing the proposed fusion algorithm performed at each time step t. Box 78 represents the object files that are generated at each time step, and provide the position, velocity and heading of the objects that are detected and tracked and the object model M for each object that is tracked. When a new frame of range data from the sensors 16, 20, 24 and 28 arrives at the host vehicle 12 at box 82, the algorithm first constructs the 360° point cloud at box 84 in the manner discussed above. Once the point cloud is constructed, the algorithm then segments the scan points in the cloud into clusters that may identify specific objects at box 86. To perform the segmenting operation, let $\mathcal{R}$ denote the scan map in the current frame (t+1) and let $G=(\mathcal{R}, E)$ be an undirected graph with vertex set $\mathcal{R}$. An edge $(p_1, p_2) \in E$ links $p_1$ and $p_2$ if $\|p_1 - p_2\|$ is less than a predefined distance threshold. The connected component labeling is then used to segment the scan map $\mathcal{R}$ into a list of clusters $\{S_n^{(t+1)}\}$. Segmenting the scan points into clusters includes separating the clusters of scan points in the return point clouds so that clusters identify a separate object that is being tracked.

Once the scan points are segmented into clusters, the algorithm then matches the clusters with the predicted object models $\tilde{M}$ at box 88. Particularly, the algorithm projects tracked object models M at the previous time step at box 90 using the object files 78. To predict the projected object models, let $\{M_t^n\}$ be a list of object models M at time step t. For every object model $M_t^n$, the mean of a Gaussian component is denoted as $y_j^n$. If $\bar{y}_t^n$ is the estimate of the transformation at time step t, the predicted transformation at time step t+1 is $\tilde{y}_{t+1}^n = f(\bar{y}_t^n)$. Therefore, the predicted object model $\tilde{M}$ for the n-th object is $\tilde{M}_{t+1}^n = \{T_{\tilde{y}_{t+1}^n}(v_j^n)\}$ for all j. By $\mathcal{L} = \cup_n \tilde{M}_n^{(t+1)}$, the predicted object points are denoted from the time step t.

Using the projected tracked object models, the segmented clusters $\mathcal{R} = \{S_{t+1}^n\}$ are matched with predicted object models $\mathcal{L}' = \{\tilde{M}_{t+1}^n\}$ at the box 88. A bipartite graph $B = (\mathcal{L}, \mathcal{R}, E_B)$ is constructed between the vertex set $\mathcal{L}$ to $\mathcal{R}$ with $E_B$ being the edge set. An edge exists between the points $p \in \mathcal{R}$ and $q \in \mathcal{R}$ if, and only if, $\|p-q\| < D$, where D is a distance threshold. The weight of the edge (p, q) is defined as $w(p, q) = \|p-q\|$. The neighborhood of $q \in \mathcal{R}$ is defined as $N(q) \equiv \{p | (p,) \in E_B\}$.

An induced bipartite graph $B' = (\mathcal{L}', \mathcal{R}', E_B,)$ can be defined from the bipartite graph B, where the edge set $E_B$ represents the possible association among the objects in $\mathcal{L}'$ and the segmented clusters $\mathcal{R}'$. An edge between $p' \in \mathcal{L}'$ and $q' \in \mathcal{R}'$ exists if, and only if, there exists an edge (p,q) in B such that $p' \in p$ and $q' \in q$.

Let the E(p', q') be the subset of the edge set in B, i.e., $E(p', q') \equiv \{(p, q) | (p, q) \in E_B \cap p \in p' \cap q \in q'\}$. The weight (p', q') and cardinality of the edge (p', q') are defined, respectively, as:

$$w(p', q') = \frac{\sum_{q \in q'} \min_{p \in N(q) \cap p \in p'} w(p, q)}{|q'|}, \quad (63)$$

$$c(p', q') = \frac{|E(p', q')|}{|q'|}. \quad (64)$$

Once the induced bipartite graph B' is constructed, and the weight and cardinality of the edges are computed, the strong edge and pruned weak link are selected using Algorithm 3 below.

Figure 10:
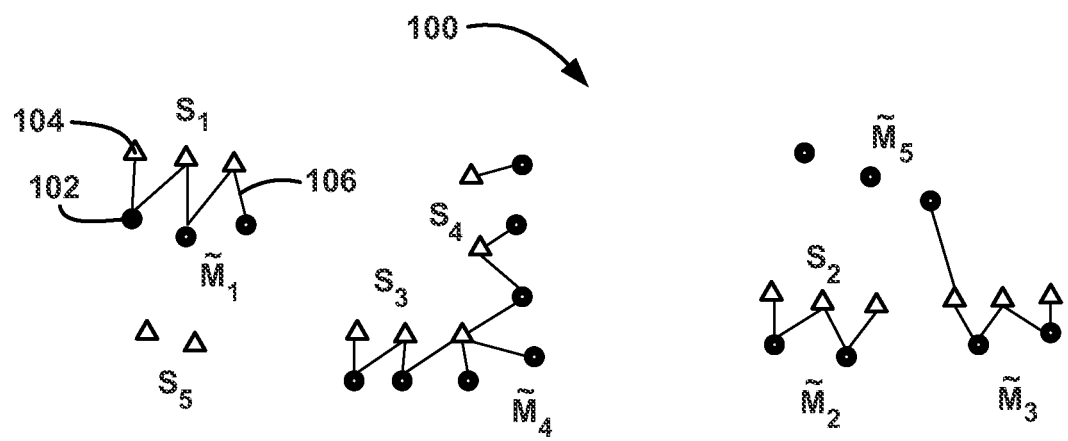
FIG. 10 is a bipartite graph showing predicted object model points and segmented scan map points for a step of matching scan clusters with predicted object models in the diagram of FIG. 9.

FIG. 10 is a bipartite graph 100, namely B, at a scan point level for five predicted object models $\tilde{M}$ and five clusters S at the current time step t as discussed above. In the bipartite graph 100, dots 102 represent the predicted object model points and triangles 104 represent the segmented scan map points. Lines 106 between the dots 102 and the triangles 104 are the edges of the graph 100.

The algorithm then merges and splits data point clusters at box 92 to combine detected objects that are the same and split objects that were originally detected as a single object, but have formed multiple objects. To provide the merging and splitting of clusters, Algorithm 3 below provides a scan association.

Figure 11:
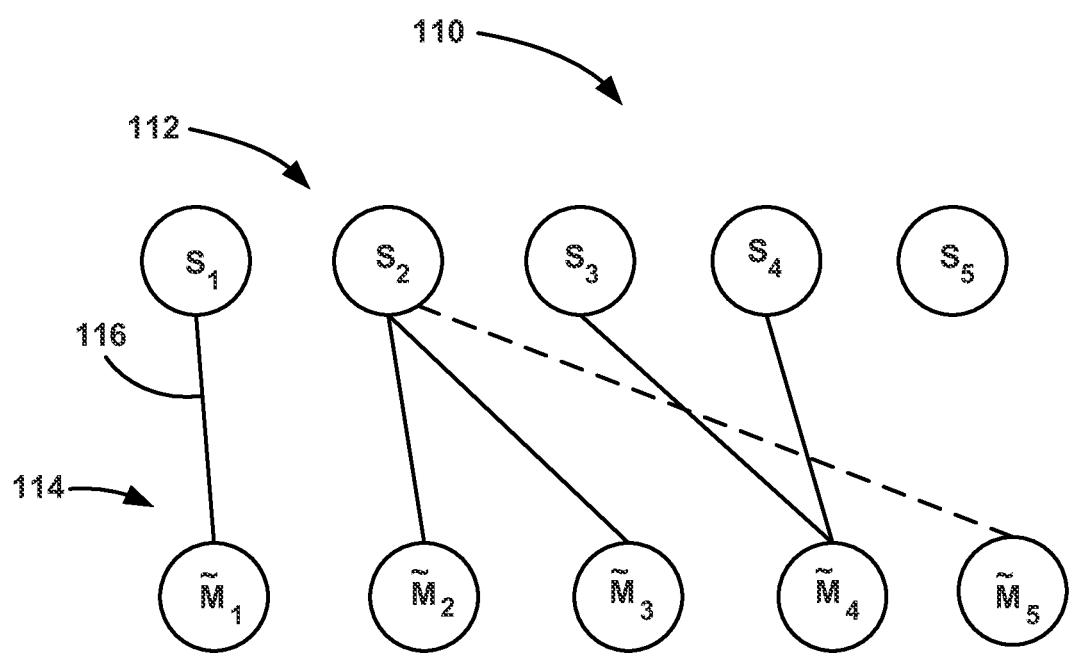
FIG. 11 is an induced bipartite graph generated from the bipartite graph shown in FIG. 10.

FIG. 11 illustrates an induced bipartite graph 110, namely B', derived from the graph B by consolidating points into groups. In the induced bipartite graph 110, nodes 114 represent the object model points (M), nodes 112 represent the clusters of the segmented scan points (M), and lines 116 represent the edges defining matching between the object model points (M) and the segmented scan points (S). As will be discussed below, $\tilde{M}_1$ at time t is matched to $S_1$ at time t+1, $\tilde{M}_2$ and $\tilde{M}_3$ are merged into $S_2$ at time t+1, $\tilde{M}_4$ at time t is split into $S_3$ and $S_4$ at time t+1, $\tilde{M}_5$ at time t is dying and being removed from the scan map at time t+1 and $S_5$ is arriving at time t+1. In Step 3 of Algorithm 3, edges $(\tilde{M}_1,S_1)$, $(\tilde{M}_2,S_2)$, $(\tilde{M}_4,S_3)$, and $(\tilde{M}_4,S_4)$ are highlighted. In Step 4, $\tilde{M}_3$ is matched with $S_2$, edge $(\tilde{M}_3,S_2)$ is highlighted. Therefore, in Step 5, the dashed line $(\tilde{M}_5,S_2)$ is pruned as the weak link. FIG. 11 illustrates that $\tilde{M}_1$ is directly matched with $S_1$, however, the two other cases need cluster merging and splitting.

The predicted object model $\tilde{M}_4$ is split into two matched clusters $S_3$ and $S_4$. The scan points of the current clusters $S_3$ and $S_4$ will be re-clustered using the prior knowledge that there used to be an object in the previous frame. Usually a stronger evidence of dissimilarity is needed for splitting an existing tracked object into two clusters.

The two predicted object models $\tilde{M}_2$ and $\tilde{M}_3$ are associated to a cluster $S_2$ in the current frame. The scan points in the cluster $S_2$ will be re-clustered since a stronger proximity among the scan points is needed for merging the two tracked objects into one object.

Algorithm 3: Scan association algorithm
Input: The clusters $\mathcal{R}'=\{S_n^{(t+1)}\}$ and the predicted object models $\mathcal{L}'=\{\tilde{M}_n^{(t+1)}\}$.
Output: The pruned induced bipartite graph B'.
1) Construct the bipartite graph B with scan points as the vertices.
2) Construct the induced graph B' with clusters and contours as the vertices, and compute the weight and cardinality of the edge using equations (63) and (64), respectively.
3) For each $q' \in \mathcal{R}'$, find $p^{*\prime} \in \mathcal{L}'$ such that the cardinality is larger than a threshold (i.e., $c(p^{*\prime}, q') > C$) and $p^{*\prime} = \arg\min_{p' \in \mathcal{L}'} w(p',q')$, and highlight the edge $(p^{*\prime}, q')$.
4) For each $p'' \in \mathcal{L}'$ which is not covered by the highlighted edges, find the set $\mathcal{R}'' \subset \mathcal{R}'$ such that each element $q''$ is covered by one and only one highlighted edge. Find $p''$ such that $(p'', q'') > C$ and $q^{*\prime\prime} = \arg\min_{q'' \in \mathcal{R}''} w(p'', q'')$, and highlight the edge $(p'', q^{*\prime\prime})$.
5) Prune all edges in B' not highlighted.

As mentioned above, new objects are created and dying objects are deleted at box 94. Particularly, two special cases need to be handled to create new objects and to remove existing objects in the object file, where there exists no edge incident to scan cluster $S_5$. A track initialization step will be triggered, and a new object will be added in the object file for scan cluster $S_5$, and predicted object model $\tilde{M}_5$ is dying since there is no edge incident from it and will be removed from the object file.

Once the new objects are created and the dying objects are deleted at the box 94, the algorithm then provides tracking and model updating at box 96. For every matched pair of object models $M_t$ and scan clusters $S_{t+1}$, provided, for example, by the scan registration process of Algorithm 1, Algorithm 2 is used for tracking and object model updating.

The object file 78 is then updated at box 98 and stored for the next time step for the object file 78. The new transformation $y_{t+1}$ and updated object model $M_t$ of every object are stored back to the object file, and the algorithm waits for the arrival of a new scan map at the next time step.

If the rotation is small between two consecutive scan frames, the parameters of a 2D transformation can be approximated by:

$$x' = x - \epsilon y + t_x, \quad (65)$$

$$y' = \epsilon x + y + t_y, \quad (66)$$

where (x,y) and (x',y') are two points in previous and current frames, respectively, $\epsilon$ is the rotation angle and $(t_x, t_y)$ is the translation.

Let $m_j = (x_j, y_j)$ and $S_k = (x_k', y_k')$. Plugging equations (65) and (66) into equation (55), the partial derivatives for $t_x$, $t_y$, and $\epsilon$, respectively, can be taken and set to zero. Let $\tilde{y} = (\tilde{t}_x, \tilde{t}_y, \tilde{\epsilon})^T$ denote the predicted y by equation (49). If a constant model is assumed, $\tilde{t}_x = v_x \delta t$, $\tilde{t}_y = v_y \delta t$ and $\tilde{\epsilon} = \omega \delta t$ are provided with $\delta t$ being the duration between times steps t and t−1.

The following updating rules can be derived:

$$t_x = \frac{\sum_{k,j} a_{kj}(x_k' + \epsilon y_j - x_j) + \lambda_x \tilde{t}_x}{\sum_{k,j} a_{kj} + \lambda_x}, \quad (67)$$

$$t_y = \frac{\sum_{k,j} a_{kj}(y_k' - \epsilon x_j - y_j) + \lambda_y \tilde{t}_y}{\sum_{k,j} a_{kj} + \lambda_y}, \quad (68)$$

$$\epsilon = \frac{\sum_{k,j} a_{kj}[(y_k' - t_k - y_j)x_j - (x_k' - t_x - x_j)y_j] + \lambda_\epsilon \tilde{\epsilon}}{\sum_{k,j} a_{kj}(x_j^2 + y_j^2) + \lambda_\epsilon}, \quad (69)$$

where $\lambda_x$, $\lambda_y$, and $\lambda_\epsilon$ are the weights derived from the covariance matrix Q in equation (50).

Replacing equation (38) with equations (67)-(69), Algorithm 1 is applied to iteratively compute $t_x$, $t_y$, and $\epsilon$ as the $\bar{y}_{t+1}$.

Let $v_H$ and $\omega_H$ denote HV ground speed and yaw rate, respectively. The ground speed of the target vehicle 14 is computed by:

$$v_{gx} = v_x + v_H - x_c \omega_H, \quad (70)$$

$$v_{gy} = v_y + y_c \omega_H, \quad (71)$$

and the heading of the target vehicle 14 by:

$$\xi = \tan^{-1}\left(\frac{v_{gy}}{v_{gx}}\right). \quad (72)$$

The method and apparatus for detecting and tracking multi-objects as described above can provide a 360° field-of-view solution for detecting objects by the host vehicle 12. However, the following issues for a LiDAR sensor need to be addressed.

The first issue is the partial observations caused either by occlusion or laser measurement failure, for example, low reflectance or mirror reflection. For example, the detection range of a black color vehicle is much less than that of a white color vehicle.

The next issue is the sparse measurement due to low resolution that causes low feature saliency and, thus, is insufficient in detecting far-field objects.

Another issue is the limited vertical field-of-view, such as 4°, that causes missing detection of objects on a non-flat road surface.

Another issue is the lack of context information that can distinguish an object from clutter background.

The present invention proposes an enhanced fusion algorithm to address the limitations discussed above for the LiDAR sensors. Particularly, the present invention uses outputs from one or both of a radar sensor or a vision system on the vehicle to operate as a cueing signal to cause the fusion system for the LiDAR sensor outputs to identify a target.

Radar sensors typically have a far range, but a narrow field-of-view. Vision systems typically have a short field-of-view, but provide contacts to the detected target. As above, the enhanced fusion system being discussed is designed to estimate the parameters x, y, $v_x$, $v_y$ and $\xi$ for every detected object.

Figure 12:
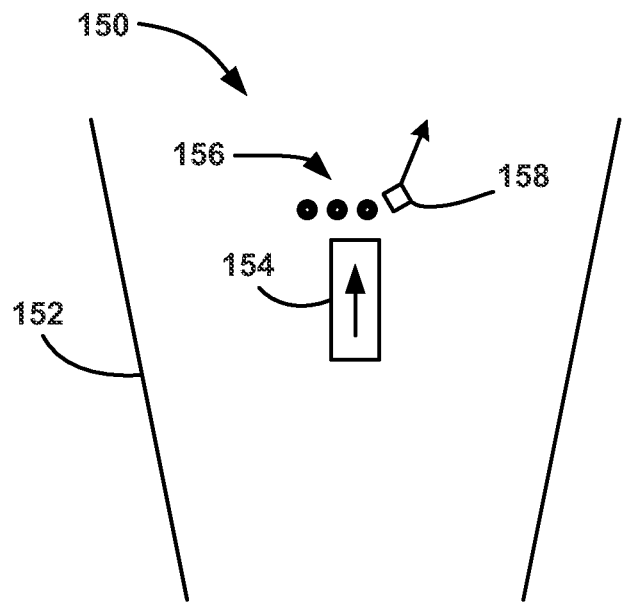
FIG. 12 is an illustration of scan points from a LiDAR sensor, a vision system and a radar sensor.

FIG. 12 is an image 150 of a target displayed within a roadway 152 as detected by a LiDAR sensor, a radar sensor and a vision system on a host vehicle. Particularly, the target is at a far enough distance away, or is occluded, so that the LiDAR scan points are few, as represented by dots 156. To enhance the detection of the target, a vision system image 154 defines the same target from a vision system output and a radar data point 158 represents the same target as detected by a radar sensor.

Figure 13:
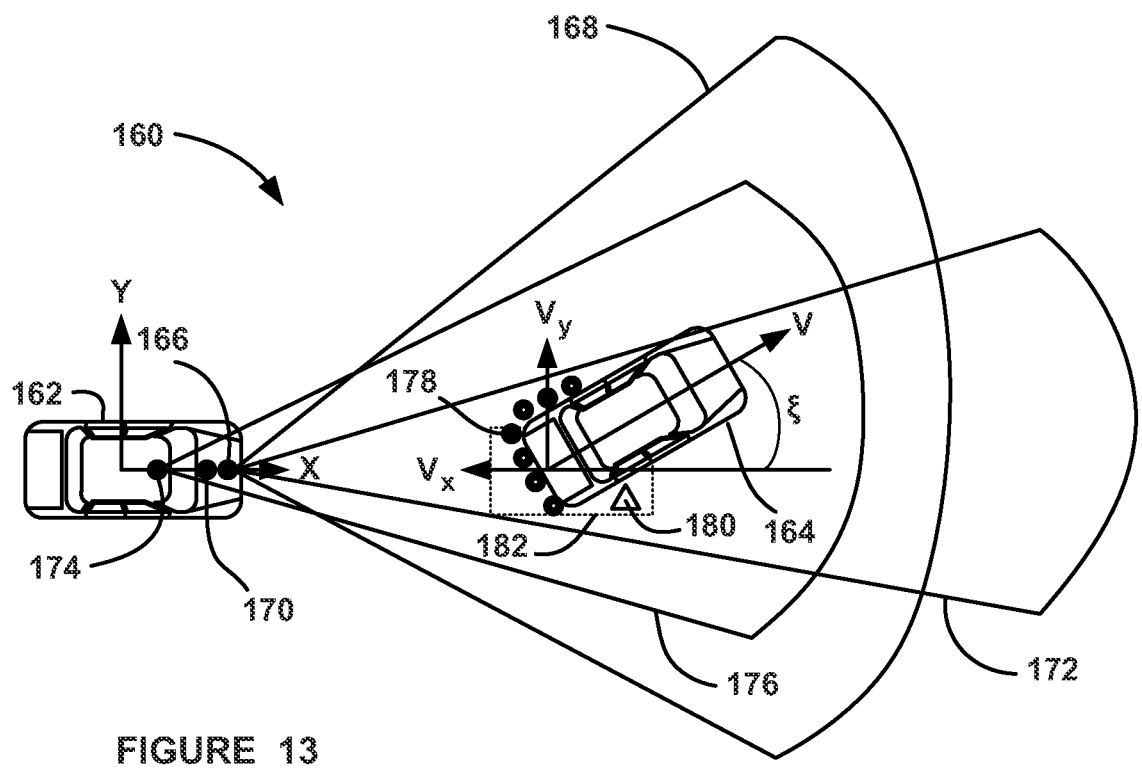
FIG. 13 is an illustration of a host vehicle following a target vehicle and showing the fields-of-view of a LiDAR sensor, a radar sensor and a vision system on the host vehicle.

FIG. 13 is an illustration of a vehicle system 160 similar to the system 10 discussed above for a host vehicle 162 trailing and tracking a target vehicle 164. The same variables for position, velocity, heading angle, etc. are used as that shown in FIG. 1. In this example, the host vehicle 162 includes a LiDAR sensor 166 having a field-of-view 168, a radar sensor 170 having a field-of-view 172 and a vision system 174 having a field-of-view 176. The returns from the LiDAR sensor 166 are shown as scan points 178, the return from the radar sensor 170 is designated as triangle 180 and the return from the vision system 174 is represented as box 182. As is known in the art, vision systems and radar sensors give four outputs from a target, namely, the range to the target, the change in the range to the target, i.e. range rate, the heading angle of the target and the change in the azimuth angle of the target, i.e., azimuth angle rate.

Figure 14:
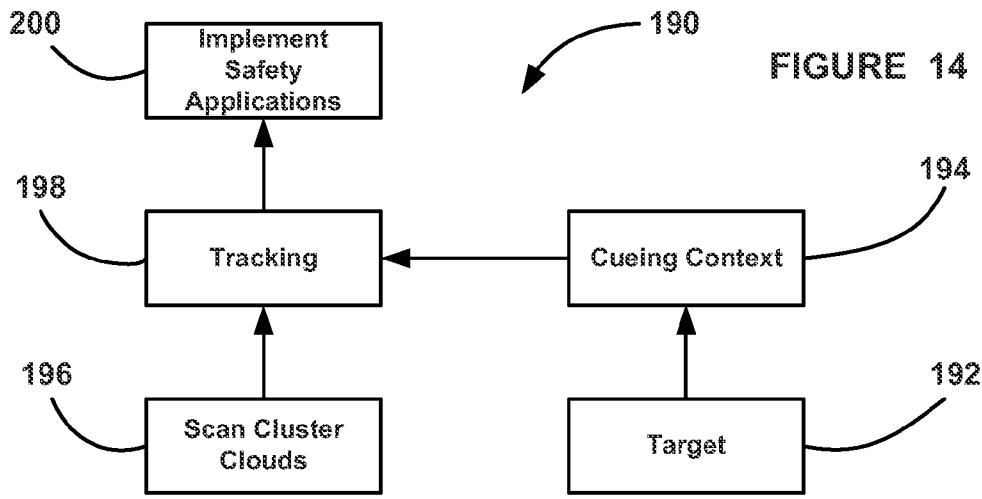
FIG. 14 is a general flow diagram for a tracking algorithm for a LiDAR sensor employing cueing from a radar sensor or a vision system.

FIG. 14 is a block diagram of a general overview of a proposed fusion system 190. At each time step, the target $O=(o_1, o_2, \ldots, o_{n_o})$ captured from the radar sensor 170 and/or the vision system 174 is sent from box 192 to a cueing context block 194. As discussed above, the LiDAR scan cluster maps are provided at block 196 to a LiDAR tracking algorithm block 198. The tracking algorithm receives the cueing context target data from the block 194 and the target data is matched with the stored object model, where the value $n_o$ is the number of detected targets. Every target $o_i=(x_i'', y_i'', v_i'', w_i'')$ has the parameters of longitudinal displacement (x"), lateral displacement (y"), radial velocity (v"), and lateral velocity (w"). The LiDAR scan map $\mathcal{R}=(s_1, s_2, \ldots, s_N)^T$ with each scan point $s_k$ includes a longitudinal offset $x_i''$ and a lateral offset $y_i''$, where N is the number of scan points. The tracking algorithm monitors the input from the cueing context box 194 and the LiDAR scan map, and generates the output parameters x, y, $v_x$, $v_y$, and $\xi$ for every detected object. An application block 200 uses the estimated parameters of the objects, and implements vehicular active safety applications, such as adaptive cruise control, collision mitigation braking, etc.

Figure 15:
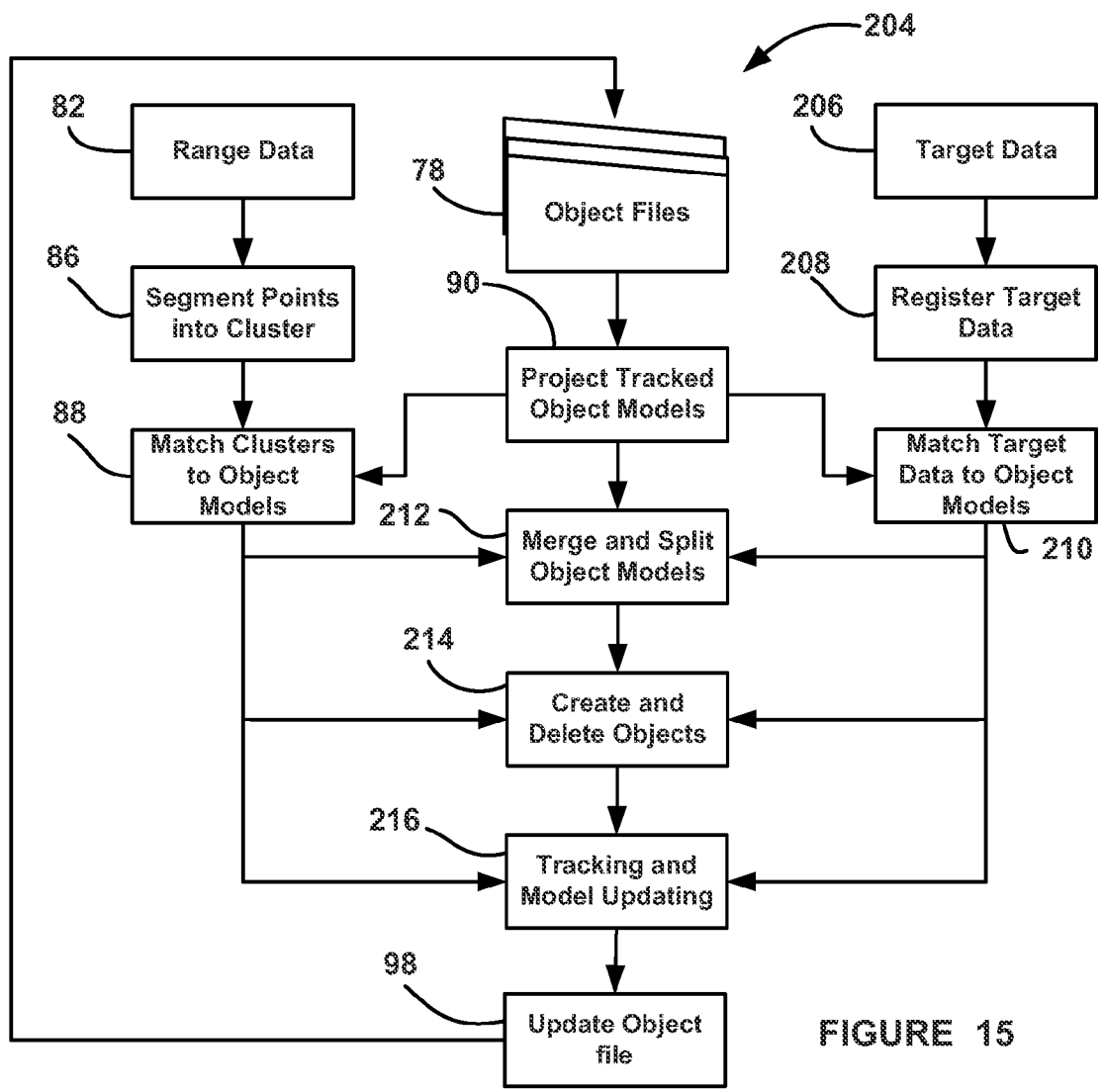
FIG. 15 is a flow chart diagram showing a process for a multi-object tracking algorithm that employs cueing from a radar sensor or a vision system.

FIG. 15 is a flow chart diagram 204 similar to the flow chart diagram 80 discussed above, where the same operations are identified with the same reference number. The flow chart diagram 204 includes box 206 that reads the target data from the radar sensor 170 or the vision system 174. Next, the algorithm registers the target data to the LiDAR coordinate frame at box 208. To accomplish this, let $y_0$ be the parameters (translation and rotation) of the rigid transformation T that maps a target from the radar sensor 170 or the vision system 174 to the LiDAR coordinate frame, so that the mapped targets in the LiDAR frame are:

$$o_i' = T_{y_o}(o_i). \tag{73}$$

The registration parameter $y_0$ can be automatically estimated through matched pairs between the tracked LiDAR objects and targets from the radar sensor 170 or the vision system 174. U.S. Pat. No. 7,991,550 titled, Method and Apparatus for On-vehicle Calibration and Orientation of Object-Tracking Systems, issued Aug. 7, 2011, assigned to the assignee of this application and herein incorporated by reference, discloses one suitable technique for this purpose.

Figure 16:
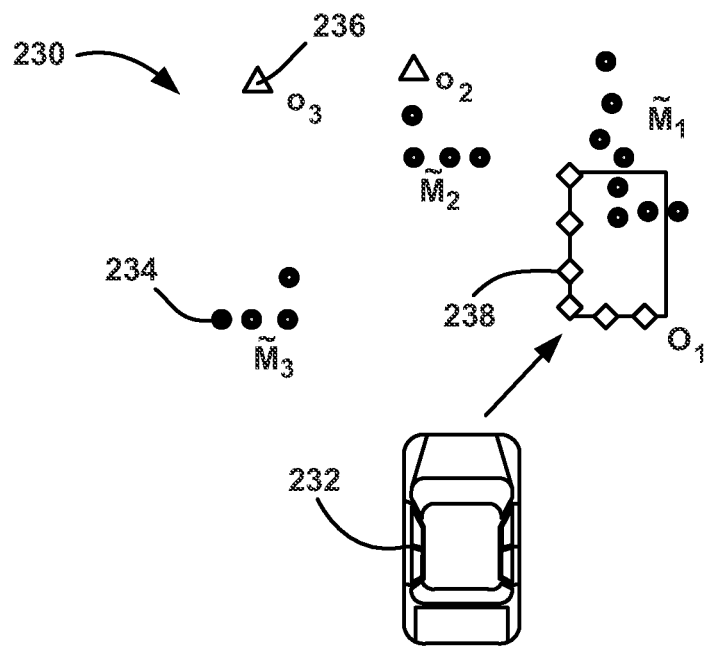
FIG. 16 is a bipartite graph showing matching target data with object models for all of LiDAR scan points, radar sensor returns and a vision system images.

Next, the algorithm matches the target data from the radar sensor 170 or the vision system 174 to object models Mat box 210. This process is illustrated in FIG. 16 as image 230 including a host vehicle 232, where dots 234 are object model points, triangles 236 are radar targets and diamonds 238 are virtual scan points derived from the image data from the vision system 174. A radar target $o_r$ is modeled by a point represented by the triangles 236. A vision target $O_v$ is modeled as a rectangle, which can be represented by a list of points sampled on the edge of the rectangle by "virtual" scan lines incident from the host vehicle 232. The value $O_v=\{o_l|l=1,\ldots,6\}$ is shown as the diamonds 238. The set of object models $\mathcal{L}'=\{\tilde{M}_n\}$ and scan points of all object models $\mathcal{L}'=\cup_n \tilde{M}_n$ are defined. Let $\mathcal{R}=\{o_i\}$ denote all of the target points, either triangles or diamonds, from the radar sensor 170 or the vision system 174, respectively.

Figure 17:
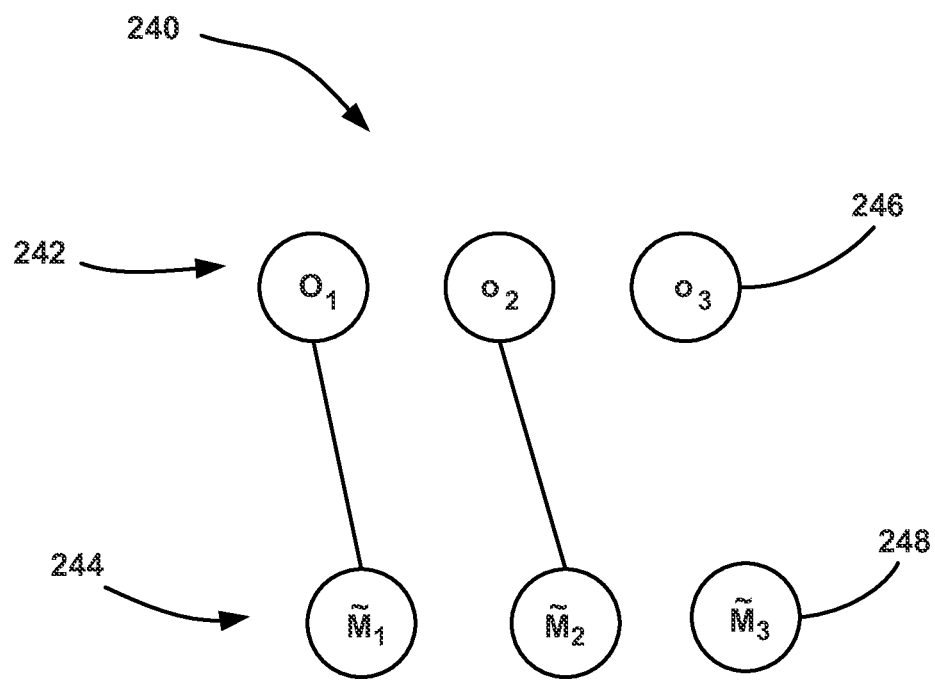
FIG. 17 is an induced bipartite graph generated from the bipartite graph shown in FIG. 16.

The procedure discussed above is employed to construct a pruned bipartite graph 240 shown in FIG. 17. The graph 240 shows the object motion 242 at nodes 246 and the object models 244 at nodes 248, where $o_1 \leftrightarrow \tilde{M}_1$, $o_2 \leftrightarrow \tilde{M}_2$, $o_3$ is a candidate for crating a new object, and predicted object model $\tilde{M}_3$ is flagged as dying that may be removed from the object file.

Figure 18:
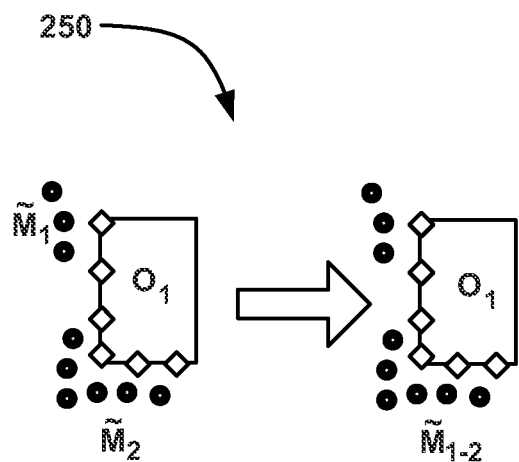
FIG. 18 is a bipartite graph showing merging of two projected object models by providing matching using a vision system.

Using the projected track object models $\tilde{M}$ from the box 90, the matched clusters with projected object models $\tilde{M}$ from the box 88 and the matched target data with the object models from the box 210, the algorithm provides merging and splitting of object models M at box 212. Two cases are considered, namely, vision targets and radar targets. FIG. 18 shows a bipartite graph 250 for the case where two predicted object models $\tilde{M}_1$ and $\tilde{M}_2$ are matched to the vision target $O_1$. This cueing information from the vision system 74 provides evidence that the two object models $\tilde{M}_1$ and $\tilde{M}_2$ need to be merged as a new object model $\tilde{M}_{1-2}$.

Figure 19:
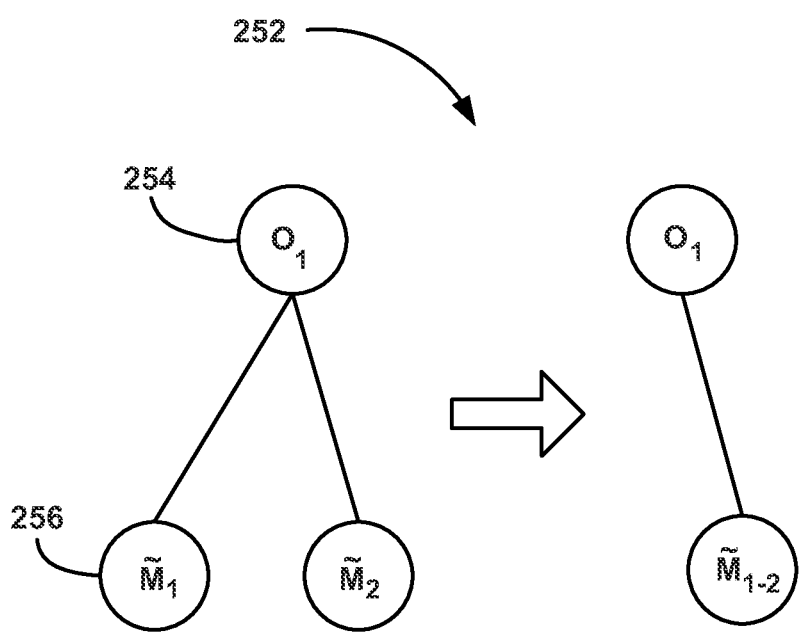
FIG. 19 is an induced bipartite graph showing the matching of the object models from FIG. 18.

FIG. 19 is an induced bipartite graph 252 showing the merging of the object models $\tilde{M}_1$ and $\tilde{M}_2$ at nodes 256 from the vision target $O_1$ at node 254 into the single object model $\tilde{M}_{1-2}$.

Figure 20:
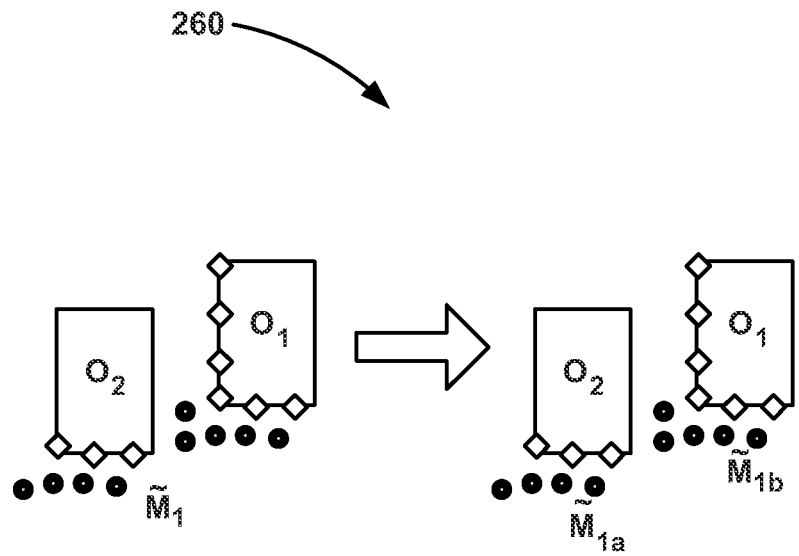
FIG. 20 is a bipartite graph showing splitting of projected object models by matching using a vision system.

FIG. 20 is a bipartite graph 260 showing another case where an object model $\tilde{M}_1$ matches two vision targets $O_1$ and $O_2$. The cueing information from the vision system 174 provides evidence that the object model $\tilde{M}_1$ needs to be split into two separate object models $\tilde{M}_{1a}$ and $\tilde{M}_{1b}$.

Figure 21:
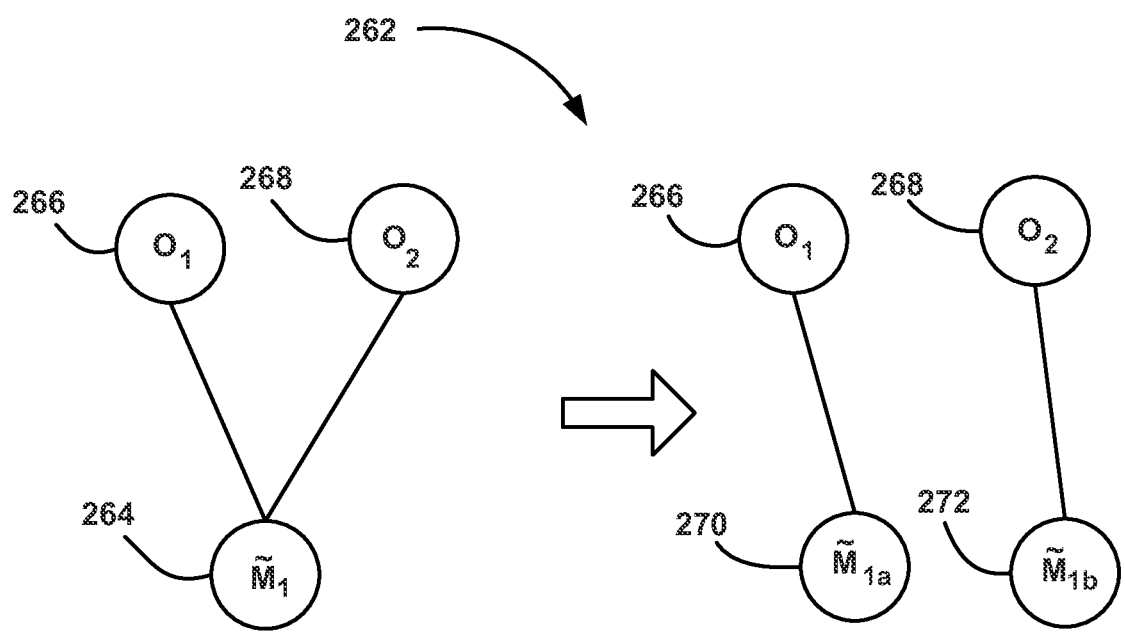
FIG. 21 is an induced bipartite graph showing the matching of the object models from FIG. 20.

FIG. 21 is an induced bipartite graph 262 showing the splitting of the object model $\tilde{M}_1$ at node 264, as detected by the two vision targets $O_1$ and $O_2$ represented by nodes 266 and 268, into the object models $\tilde{M}_{1a}$ and $\tilde{M}_{1b}$ represented by nodes 270 and 272, respectively.

Figure 22:
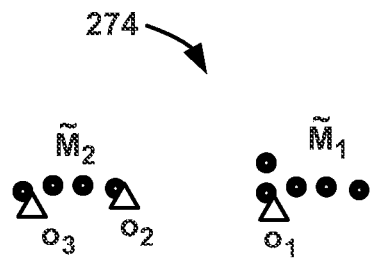
FIG. 22 is a bipartite graph showing projected object models by matching using a radar sensor.

FIG. 22 is a bipartite graph 270 showing a case where the point set $\mathcal{R}$ for two object models $\tilde{M}_1$ and $\tilde{M}_2$ is matched with three radar targets $o_1$, $o_2$ and $o_3$.

Figure 23:
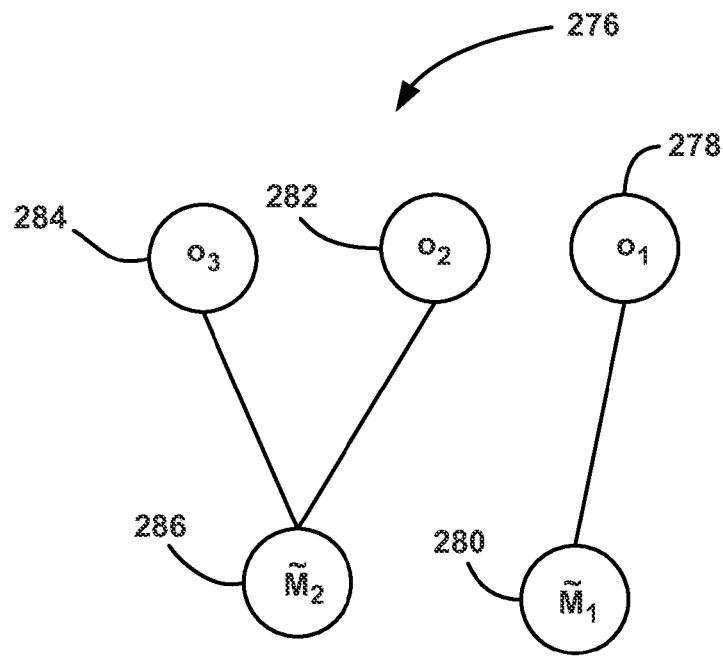
FIG. 23 is an induced bipartite graph showing the matching of the models from FIG. 22.

FIG. 23 is an induced bipartite graph 276 showing the assignment $o_1 \rightarrow \tilde{M}_1$, $o_2 \rightarrow \tilde{M}_2$ and $o_3 \rightarrow M_2$. Particularly, the graph 276 shows that the radar target $o_1$ at node 278 is matched to the object model $\tilde{M}_1$ at node 280 and the radar targets $o_2$ and $o_3$ at nodes 282 and 284, respectively, are shown merged into a single object model $\tilde{M}_2$ at node 286.

Next, the algorithm creates new objects and deletes dying objects at box 214. Similar to the procedure discussed above for the flow chart diagram 80, two special cases need to be handled to create new objects and to remove dying objects from the object file. For every unmatched scan cluster S from a LiDAR segment and every unmatched target from the radar sensor 170 or the vision system 174, a track initialization procedure is used to add a new object to the object file. For an object in the object file, if there is no match to either a segmented cluster S from the LiDAR sensor 166 or a target from the radar sensor 170 or the vision system 174, the object is flagged as dying. If the object is consistently flagged as dying in several consecutive time steps, it will be removed from the object file.

Next, the algorithm provides tracking and model updating at box 216. To accomplish this, let $o_o, \ldots, o_t,$ and $o_{t+1}$ be the mapped measurements in the LiDAR coordinate frame of a dynamic object by the radar sensor 170 or the vision system 174 at time steps $O, \ldots, t$ and $t+1$, respectively. By $o^{o:t}$ the measurement from time step O up to time step t is denoted.

Figure 24:
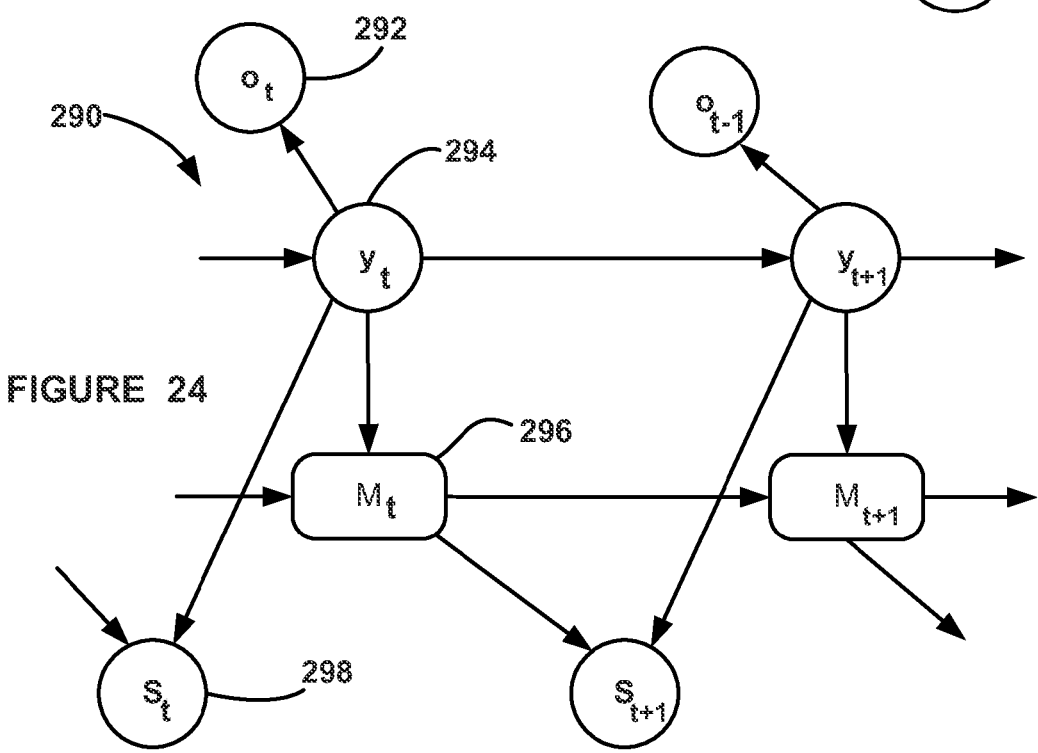
FIG. 24 is a dynamic Bayesian network for a tracking algorithm and modeling update with cueing information from a radar sensor or vision system.

FIG. 24 illustrates a revised dynamic Bayesian network 290 from FIG. 8, representing two time steps of the proposed tracking algorithm with cueing information. The values $y_t$ and $y_{t+1}$ are parameters to be estimated of the transformation at time steps t and t+1, respectively. The models $M_t$ and $M_{t+1}$ are the object models at time steps t and t+1. In the network 290, nodes 292 are the target data $o_t$ and $o_{t+1}$ at time steps t and t+1, nodes 294 are the transformation parameter y at time steps t and t+1, nodes 296 are the object models M at time steps t and t+1, and nodes 298 are the scan maps at time steps t and t+1.

Similarly as in equation (47), Bayes and Chain rules, respectively, are used to derive the posterior PDF given LiDAR scan maps and target data from the radar sensor 170 or the vision system 174 up to time step t+1 as:

$$p(y,M|S^{(0:t+1)},o^{(0:t+1)}) \propto p(S|y,M)p(o|y,M)p(y,M|S^{(0:t)},o^{(0:t)}) = p(S|y,M)p(o|y)p(y_t|S^{(0:t)},o^{(0:t)})p(M|S^{(0:t)},o^{(0:t)}), \quad (74)$$

where y and M are $y_{t+1}$ and $M_t$ in short, $S^{(0:t+1)}$ represents scan maps up to time step t+1, S is the scan map at t+1, $o=o_{t+1}$ is the measured target at time step t+1 in short, and the last equality follows by assume conditional independence given $S^{(0:t)}$ and $o^{(0:t)}$.

In equation (74), $p(y,M|S^{(0:t)},o^{(0:t)})$ is the prior PDF of y at time step t+1 given previous scan maps $S^{(0:t)}$ and target data $o^{(0:t)}$, which can be computed as:

$$p(y|S^{(0:t)},o^{(0:t)}) = \int p(y|y_t)p(y_t|S^{(0:t)},o^{(0:t)})dy_t, \quad (75)$$

where $p(y_t|S^{(0:t)},o^{(0:t)})$ denotes the posterior PDF for transformation parameter at t, and $p(y|y_t)$ represents the plant model equation (49).

If $p(y_t|S^{(0:t)},o^{(0:t)})$ is assumed to be a Dirac delta distribution centered at $\bar{y}_t$, the prior PDF at time step t+1 can be written as:

$$p(y_t|S^{(0:t)},o^{(0:t)}) = \mathcal{N}(y|\tilde{y},Q), \quad (76)$$

where $\tilde{y}$ is the predicted value of the following plant model of the object $\tilde{y}=f(\bar{y}_t)$.

Now consider the posterior of the object model M, where:

$$p(M_{t-1}|S^{0:t}, o^{(0:t)}) = \Pi_j \mathcal{N}\left(m_j | v_j, \frac{\sigma^2}{\eta_j}\right), \quad (77)$$

and where $$\mathcal{N}\left(m_j | v_j, \frac{\sigma^2}{\eta_j}\right)$$

is defined in equation (51). As shown in FIG. 24, the prior network for the object model at time t step can be written as:

$$p(M | S^{(0:t)}, o^{(0:t)}) = p(M | y_t, M_{t-1}) = \Pi_j \mathcal{N}\left(m_j | T_{\bar{y}_t}(v_j), \frac{\sigma^2}{\eta_j}\right), \quad (78)$$

Now consider the problem of estimating the posterior at time step t+1, which is factorized as:

$$p(y,M|S^{(0:t+1)},o^{(0:t+1)}) = p(y|S^{(0:t+1)},o^{(0:t+1)})p(M|S^{(0:t+1)},o^{(0:t+1)}), \quad (79)$$

and independently computed as the following two steps.

Assume $p(y|S^{(0:t+1)},o^{(0:t+1)})$ is the Dirac delta PDF centered at $\bar{y}_{t+1}$, which can be estimated by maximizing equation (74) with respect to y.

The measurement model of the target data p(o|y) is modeled as:

$$o=h(y)+v, \quad (80)$$

where $v$ is a zero-mean Gaussian random variate with covariance matrix E. Thus, p(o|y) is a Gaussian PDF, i.e.:

$$p(o|y) = \mathcal{N}(o|h(y),E), \quad (81)$$

Plugging equations (76) and (81) into equation (74), applying a negative logarithm to equation (74), and neglecting terms irrelevant to y, the following is obtained:

$$\bar{y}_{t+1} = \arg\min_y -\Sigma_{kj} a_{kj} \log K_\sigma(T_y^{-1}(s_k)-m_j)+o-hyE2+y-yQ2, \quad (82)$$

where $m_j = T_{\bar{y}_t}(v_j)$ and $\|\alpha\|_\Sigma^2 = \alpha^T \Sigma^{-1} \alpha$.

Therefore, equation (38) in Algorithm 1 can be replaced with equation (55) for integrating prior information of previous time steps and cueing information from the radar sensor 170 or the vision system 174, and then applying Algorithm 1 to derive $\bar{y}_{t+1}$.

When computing $p(M|S^{(o:t+1)}, 0^{(0:t+1)})$, it is noted that equation (78) and equation (53) are equivalent, and thus, the same updating rules of hyper-parameters described above are applied.

The object file 78 is then updated at the box 98 in the manner as discussed above.

As will be well understood by those skilled in the art, the several and various steps and processes discussed herein to describe the invention may be referring to operations performed by a computer, a processor or other electronic calculating device that manipulate and/or transform data using electrical phenomenon. Those computers and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for fusing outputs from multiple LiDAR sensors, said method comprising:
providing object files for objects detected by the LiDAR sensors at a previous sample time, said object files having object models that identify a position, orientation and velocity of the objects detected by the sensors;

tracking the object models of the objects detected by the sensors;

projecting tracked object models in the object files from the previous scan time to provide predicted object models;

receiving a plurality of scan returns from objects detected in a field-of-view of the sensors at a current sample time;

segmenting the scan returns into predicted scan clusters where each scan cluster initially identifies an object detected by the sensors;

matching the predicted scan clusters with the predicted object models; and merging predicted object models that have been identified as separate scan clusters in the previous sample time but are now identified as a single scan cluster in the current sample time.

2. The method according to claim 1 wherein segmenting the scan returns includes separating clusters of scan points so that the clusters identify a separate object that is being tracked.

3. The method according to claim 1 wherein matching the predicted scan clusters with the predicted object models includes generating a bipartite graph that matches the scan clusters to the predicted object models.

4. The method according to claim 1 wherein generating a bipartite graph includes positioning the scan points at vertices of the graph.

5. The method according to claim 1 wherein merging predicted object models includes converting the bipartite graph to an induced bipartite graph showing the object models that are being merged.

6. The method according to claim 5 wherein converting the bipartite graph to an induced bipartite graph includes computing weights and a cardinality of edges for the induced bipartite graph, where each weight identifies a positional change of one of a scan points for the at least one sensor to a location of a scan point for another one of the sensors and the edges define matching between object model points and segmented scan points.

7. The method according to claim 6 wherein converting the bipartite graph to an induced bipartite graph includes comparing the cardinality of the edges to a threshold and highlighting the edge if the cardinality is greater than the threshold, and wherein an edge is removed if it not highlighted.

8. The method according to claim 1 wherein the LiDAR sensors are on a vehicle.

9. A method for fusing outputs from multiple LiDAR sensors, said method comprising:

providing object files for objects detected by the LiDAR sensors at a previous sample time, said object files having object models that identify a position, orientation and velocity of the objects detected by the sensors;

tracking the object models of the objects detected by the sensors;

projecting tracked object models in the object files from the previous scan time to provide predicted object models;

receiving a plurality of scan returns from objects detected in a field-of-view of the sensors at a current sample time;

segmenting the scan returns into predicted scan clusters where each scan cluster initially identifies an object detected by the sensors;

matching the predicted scan clusters with the predicted object models; and splitting predicted object models that have been identified as a single scan cluster in the previous sample time but are now identified as separate scan clusters in the current sample time.

10. The method according to claim 9 wherein segmenting the return scans includes separating the clusters of scan points in the point cloud so that the clusters identify a separate object that is being tracked.

11. The method according to claim 10 wherein matching the predicted scan clusters with the predicted object models includes generating a bipartite graph that matches the scan clusters to the predicted object models.

12. The method according to claim 11 wherein generating a bipartite graph includes positioning scan points at vertices of the graph.

13. The method according to claim 12 wherein splitting predicted object models includes converting the bipartite graph to an induced bipartite graph showing the object models that are being split.

14. The method according to claim 13 wherein converting the bipartite graph to an induced bipartite graph includes computing weights and a cardinality of edges for the induced bipartite graph, where each weight identifies a positional change of one of a scan points for the at least one sensor to a location of a scan point for another one of the sensors and the edges define matching between object model points and segmented scan points.

15. The method according to claim 14 wherein converting the bipartite graph to an induced bipartite graph includes comparing the cardinality of the edges to a threshold and highlighting the edge if the cardinality is greater than the threshold, and wherein an edge is removed if it not highlighted.

16. The method according to claim 9 wherein the LiDAR sensors are on a vehicle.

17. A system for fusing outputs from multiple LiDAR sensors, said system comprising:

a plurality of LiDAR sensors configured to detect objects; and a processor in communication with the LIDAR sensors and being configured for:

providing object files for the objects detected by the LiDAR sensors at a previous sample time, said object files having object models that identify a position, orientation and velocity of the objects detected by the sensors;

tracking the object models of the objects detected by the sensors;

projecting tracked object models in the object files from the previous scan time to provide predicted object models;

receiving a plurality of scan returns from objects detected in a field-of-view of the sensors at a current sample time;

constructing a scan point cloud from the scan returns;

segmenting the scan points in the point cloud into predicted scan clusters where each scan cluster initially identifies an object detected by the sensors;

matching the predicted scan clusters with the predicted object models;

merging predicted object models that have been identified as separate scan clusters in the previous sample time but are now identified as a single scan cluster in the current sample time;

splitting predicted object models that have been identified as a single scan cluster in the previous sample time but are now identified as separate scan clusters in the current sample time;

creating new object models for detected objects in the current sample time that were not present in the previous sample time;
deleting object models that are no longer present in the predicted scan clusters;
providing object model updates based on the merged object models, split object models, new object models and deleted object models; and
updating the object files for the current sample time with the object model updates.

18. The system according to claim 17 wherein matching the predicted scan clusters with the predicted object models generates a bipartite graph that matches the scan clusters to the predicted object models.

19. The system according to claim 17 wherein merging predicted object models and splitting predicted object models converts the bipartite graph to an induced bipartite graph showing the object models that are being merged and split.

20. The system according to claim 19 wherein converting the bipartite graph to an induced bipartite graph includes computing weights and a cardinality of edges for the induced bipartite graph, where each weight identifies a positional change of one of a scan points for the at least one sensor to a location of a scan point for another one of the sensors and the edges define matching between object model points and segmented scan points.

* * * * *